(12) United States Patent  
Edwards et al.

(10) Patent No.: US 12,382,736 B2  
(45) Date of Patent: Aug. 5, 2025

(54) WIDE ANGLE OPTICAL ANGLE SENSOR

(71) Applicant: TEXAS INSTRUMENTS INCORPORATED, Dallas, TX (US)

(72) Inventors: Henry L. Edwards, Garland, TX (US); Udumbara Wijesinghe, Richardson, TX (US); William R. Krenik, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 462 days.

(21) Appl. No.: 17/853,121

(22) Filed: Jun. 29, 2022

(65) Prior Publication Data

US 2023/0108106 A1    Apr. 6, 2023

Related U.S. Application Data

(60) Provisional application No. 63/251,140, filed on Oct. 1, 2021.

(51) Int. Cl.  
*H10F 39/00* (2025.01)  
*G01B 11/26* (2006.01)

(52) U.S. Cl.  
CPC ......... *H10F 39/8023* (2025.01); *G01B 11/26* (2013.01); *H10F 39/8057* (2025.01)

(58) Field of Classification Search  
CPC ......... H01L 27/14605; H01L 27/14607; H01L 27/14616; H01L 27/14623; H01L 27/14625; H01L 27/14638; G01B 11/26  
See application file for complete search history.

(56) References Cited

U.S. PATENT DOCUMENTS

| 5,654,565 | A | 8/1997 | Hokari |
| 6,943,887 | B2 | 9/2005 | Quinn et al. |
| 8,501,636 | B1 * | 8/2013 | Wang ............... H01L 21/02052 438/906 |
| 8,716,821 | B2 | 5/2014 | Edwards et al. |
| 8,742,523 | B2 | 6/2014 | Edwards et al. |
| 9,212,992 | B2 | 12/2015 | McNutt |

(Continued)

FOREIGN PATENT DOCUMENTS

JP    2009218457 A  *  9/2009  ......... H01L 27/1443

OTHER PUBLICATIONS

OPT3001 datasheet:http://www.ti_com/product/OPT3001/datasheet/mechanical_packaging_and_orderable_information, pp. 1-43, Dec. 2014.

(Continued)

*Primary Examiner* — Kevin K Pyo  
(74) *Attorney, Agent, or Firm* — Andrew R. Ralston; Frank D. Cimino

(57) ABSTRACT

An integrated circuit includes a semiconductor substrate with a semiconductor surface layer having a first conductivity type and a top surface, a diode including a buried region within the surface layer, the buried region having an opposite second conductivity type and being spaced apart from the top surface by a portion of the semiconductor surface layer having the first conductivity type, a dielectric layer over the surface layer, and a metal layer located over the dielectric layer and including an aperture extending laterally in a first direction over the semiconductor surface layer and laterally spaced apart from the buried region in a second direction.

21 Claims, 21 Drawing Sheets

(56) References Cited

U.S. PATENT DOCUMENTS

| | | |
|---|---|---|
| 10,069,023 B2 | 9/2018 | Becker et al. |
| 2006/0145207 A1 | 7/2006 | Kim et al. |
| 2007/0080419 A1 | 4/2007 | Shizukuishi |
| 2009/0057735 A1 | 3/2009 | Beak et al. |
| 2009/0243016 A1 | 10/2009 | Kawahara et al. |
| 2009/0284731 A1 | 11/2009 | Jin et al. |
| 2011/0254118 A1 | 10/2011 | Shafi et al. |
| 2013/0207168 A1 | 8/2013 | Edwards et al. |
| 2015/0145097 A1 | 5/2015 | Basu et al. |

OTHER PUBLICATIONS

PIN diode, Wikipedia, the free encyclopedia, https://en.wikipedia.org/wiki/PIN_diode, pp. 5, 2015.

Latchup, Wikipedia, the free encyclopedia, https://en.wikipedia.org/wiki/Latchup, pp. 4, 2015.

\* cited by examiner

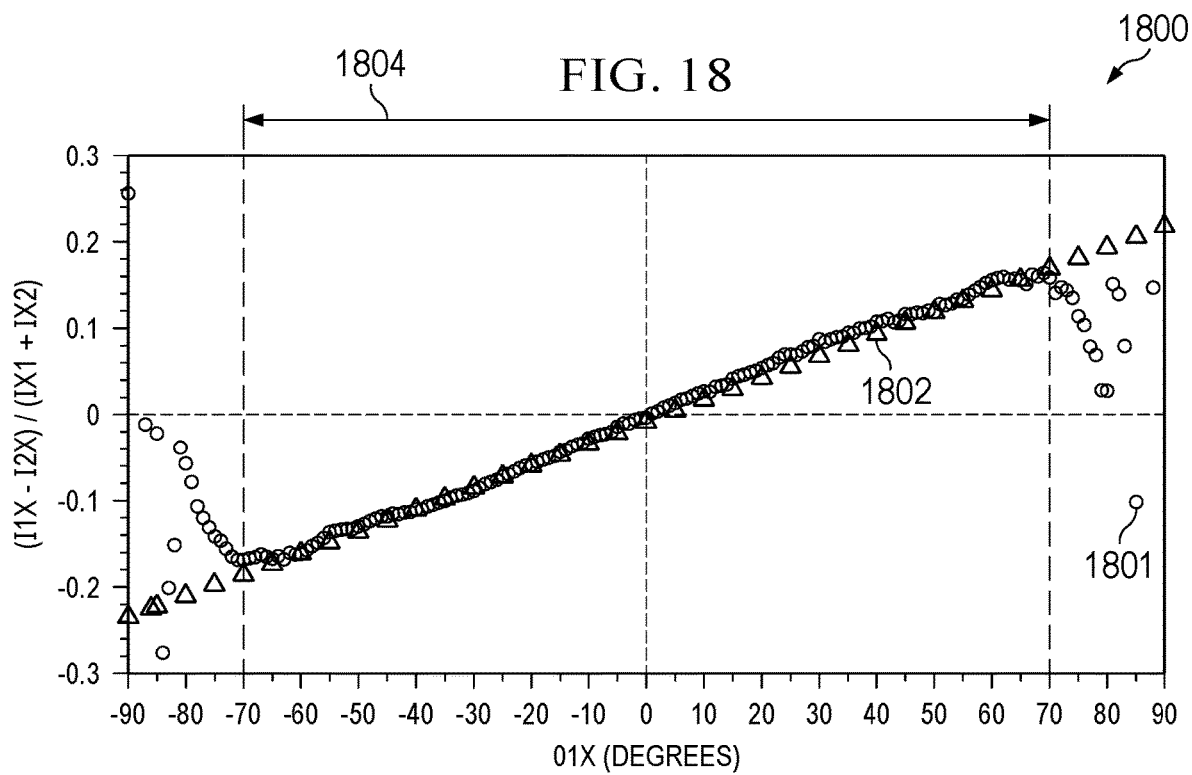
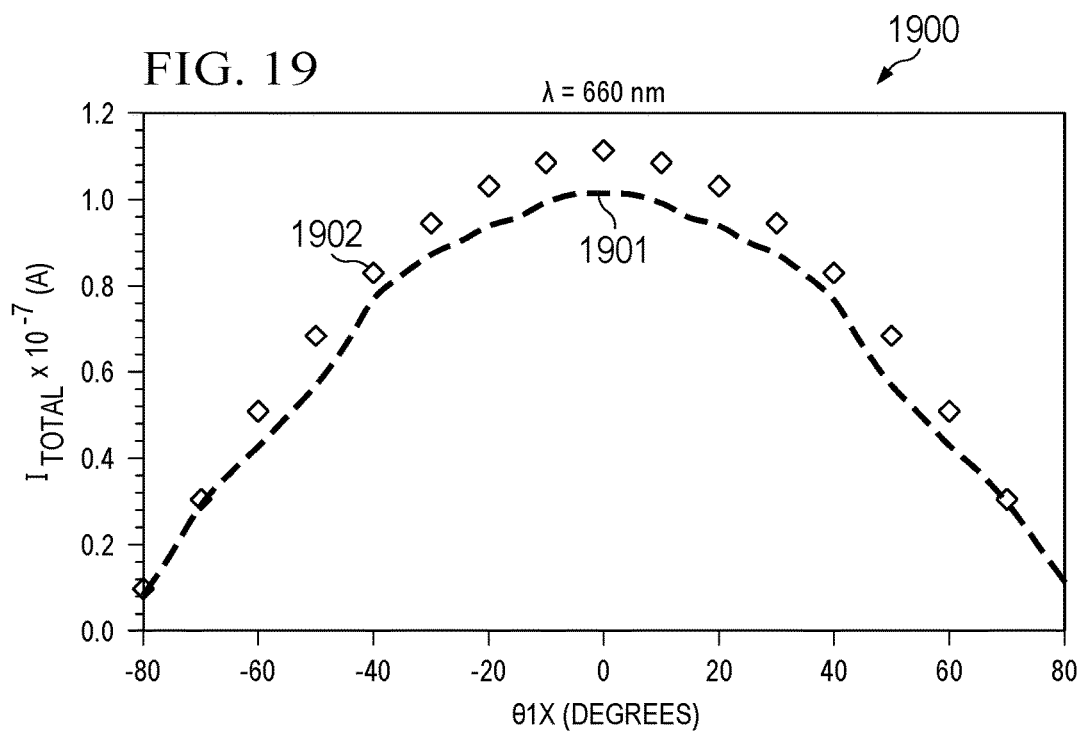

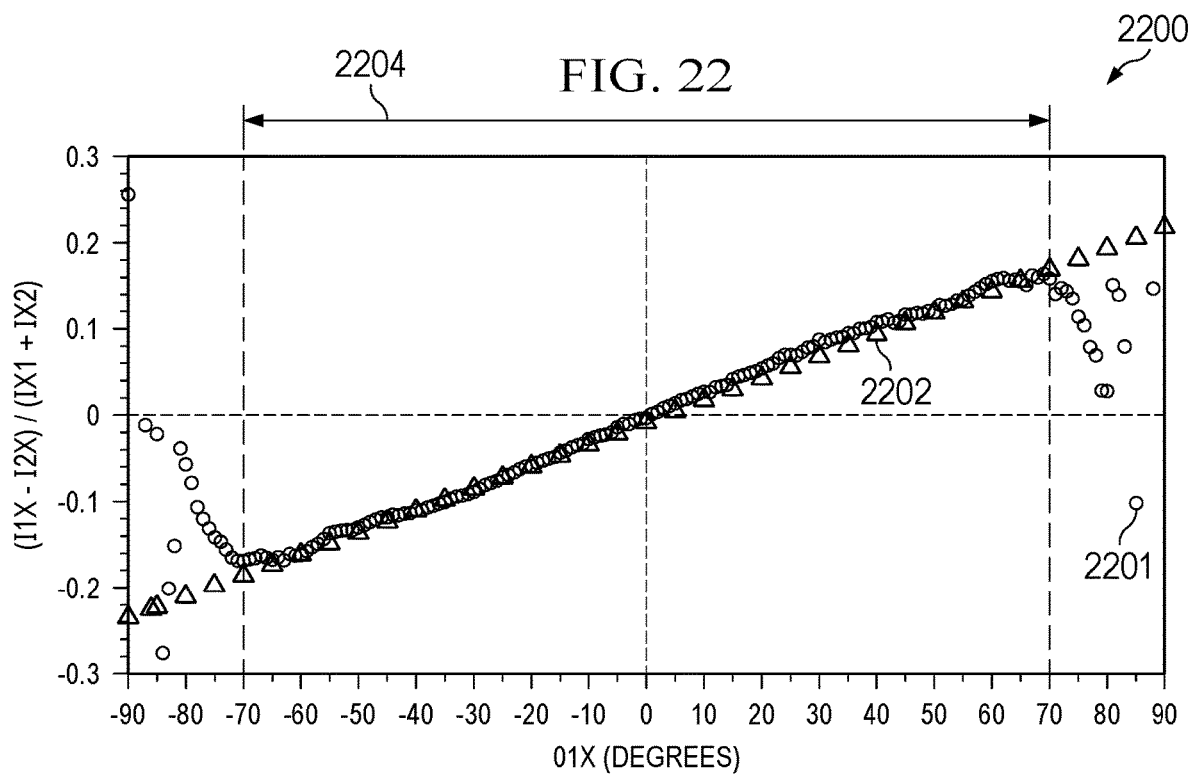

WIDE ANGLE OPTICAL ANGLE SENSOR

CROSS-REFERENCE TO RELATED APPLICATION

This application claims priority to and benefit of U.S. Provisional Patent Application Ser. No. 63/251,140, filed on Oct. 1, 2021, and titled "Wide Angle Optical Angle Sensor", the contents of which are hereby fully incorporated by reference.

BACKGROUND

Optical angle sensors can be used to sense the angle of incident light for a variety of applications, such as position detection and tracking. Wide angle optical sensing devices generally require external optics such as a fish-eye lens to collect and focus the light, as well as a digital camera to form the image and a digital processor to analyze the image and calculate the position of the object within the image. However, wide-angle lens systems may not have linear performance across a wide field of view, and the addition of the lens, camera and computer increase the system cost and complexity.

SUMMARY

In one aspect, an integrated circuit includes a semiconductor substrate with a semiconductor surface layer having a first conductivity type and a top surface, a diode including a buried region within the surface layer, the buried region having an opposite second conductivity type and being spaced apart from the top surface by a portion of the semiconductor surface layer having the first conductivity type, a dielectric layer over the surface layer, and a metal layer located over the dielectric layer and including an aperture extending laterally in a first direction over the semiconductor surface layer and laterally spaced apart from the buried region in a second direction.

In another aspect, an integrated circuit includes a semiconductor substrate with a semiconductor surface layer having a first conductivity type and a top surface, a first diode including a first buried region within the surface layer and a second diode including a second buried region within the surface layer, the first and second buried regions having an opposite second conductivity type, a length along a long axis in a first direction and a width along a short axis in a second direction orthogonal to the first direction, the length being at least 10 times the width and the first and second well regions laterally spaced apart within the surface layer along the second direction, a dielectric layer over the surface layer, and a metal layer located over the dielectric layer and including an aperture extending laterally between the cathode regions, the aperture having a second width less than a distance between the well regions.

BRIEF DESCRIPTION OF THE DRAWINGS

FIGS. 18-20 are graphs of performance data of the optical angle sensor electronic device of FIGS. 1-1D.

FIGS. 21-23 are graphs of performance data of the optical angle sensor electronic device of FIGS. 2-2B.

DETAILED DESCRIPTION

Figure 1:
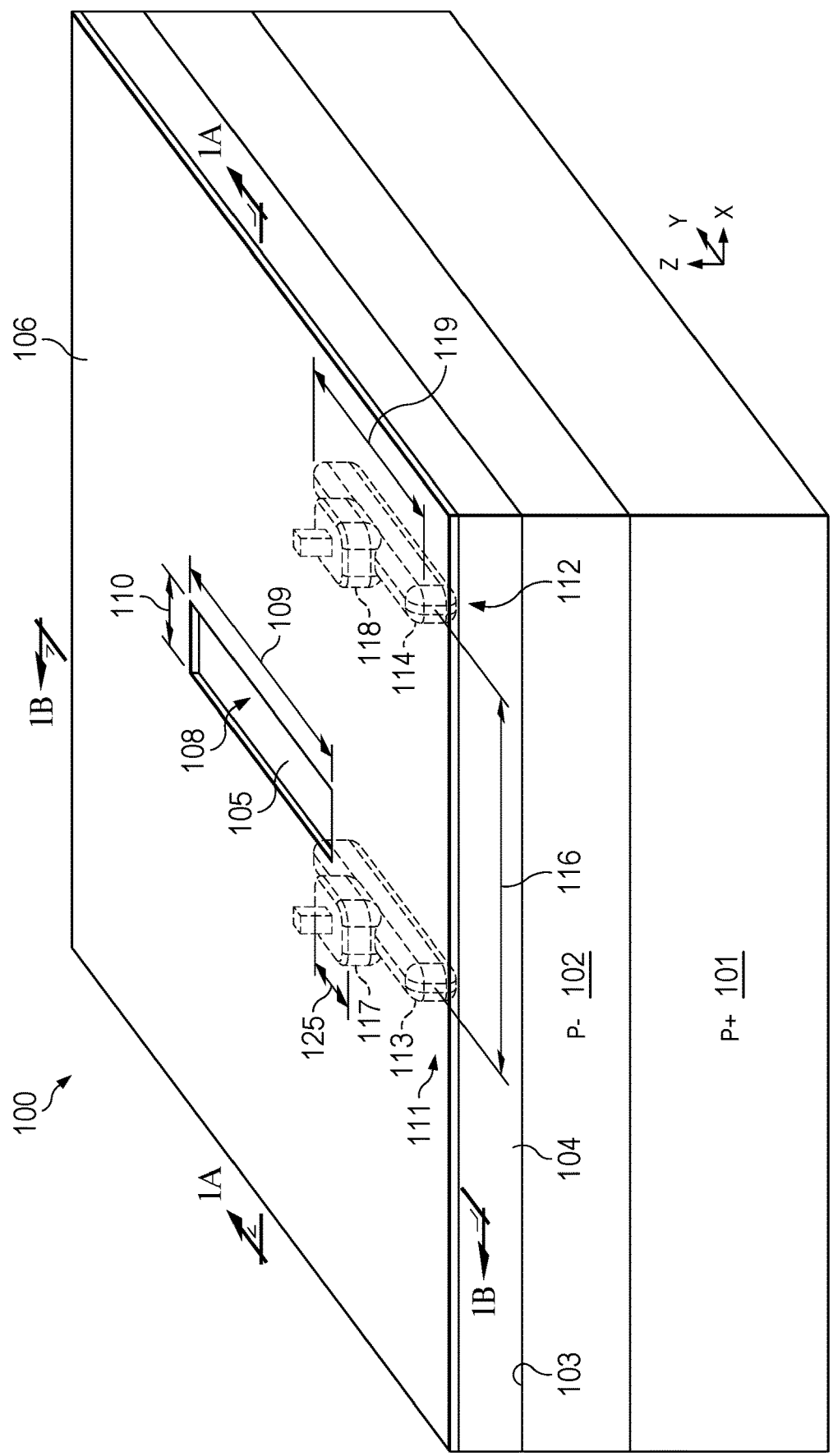
FIG. 1 is a perspective view of an optical angle sensor electronic device having an elongated rectangular sensor aperture and two longitudinal cathodes for sensing an optical angle in one dimension.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating. In the following description, a layer or structure may be described as extending or otherwise being above or over a second layer or structure, which structural relationship includes examples where the first layer or structure extends directly on and contacts all or a portion of the second layer or structure, as well as examples in which other materials, such as impurities or artifacts or remnant materials from the fabrication processing may be present between the first layer or structure and the second layer or structure.

Various disclosed devices and methods of the present disclosure may be beneficially applied to sensing light, and more particularly but not exclusively to determining a direction of a light source relative to an optical sensor. While such embodiments may be expected to provide improvements in performance relative to baseline implementations, such as a greater angular range of detection and/or improved linearity of detection over a useful angular range, no particular result is a requirement of the present invention unless explicitly recited in a particular claim.

Figure 1A:
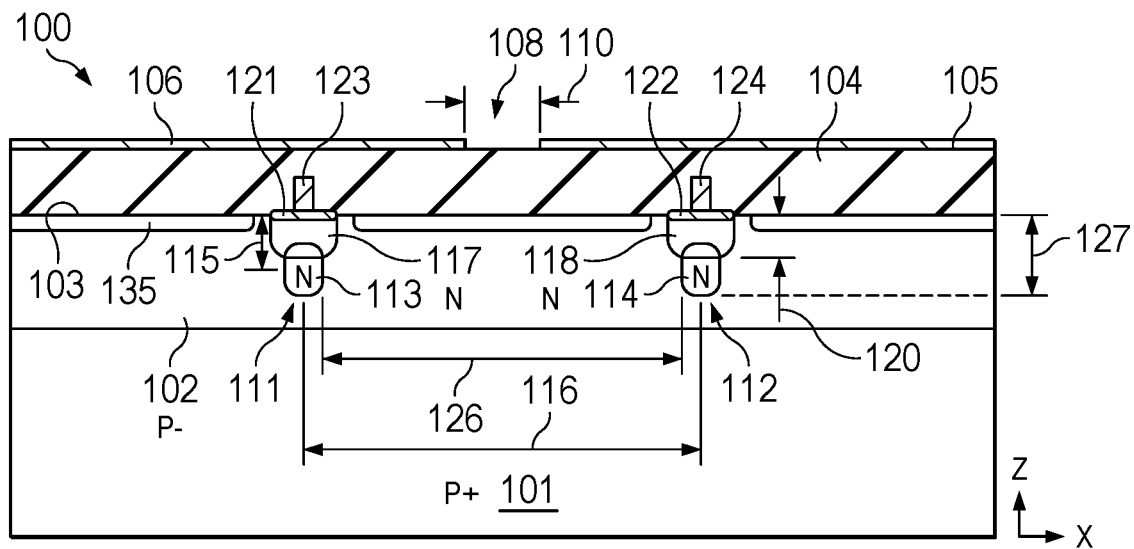
FIG. 1A is a sectional end view of the optical angle sensor taken along line 1A-1A of FIG. 1.
Figure 1B:
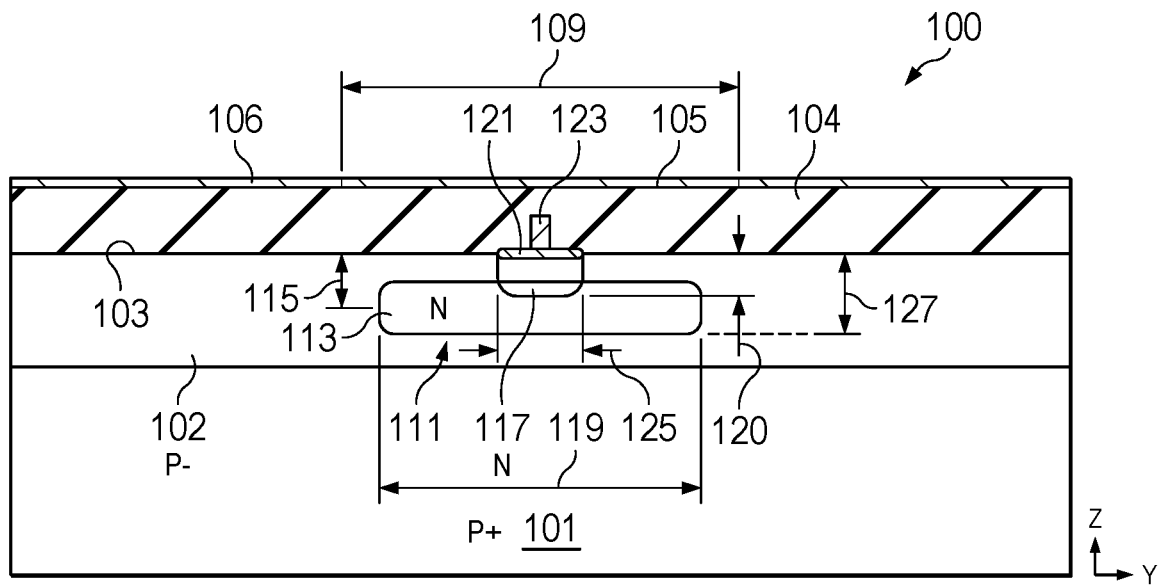
FIG. 1B is a sectional side view of the optical angle sensor taken along line 1B-1B of FIG. 1.
Figure 1C:
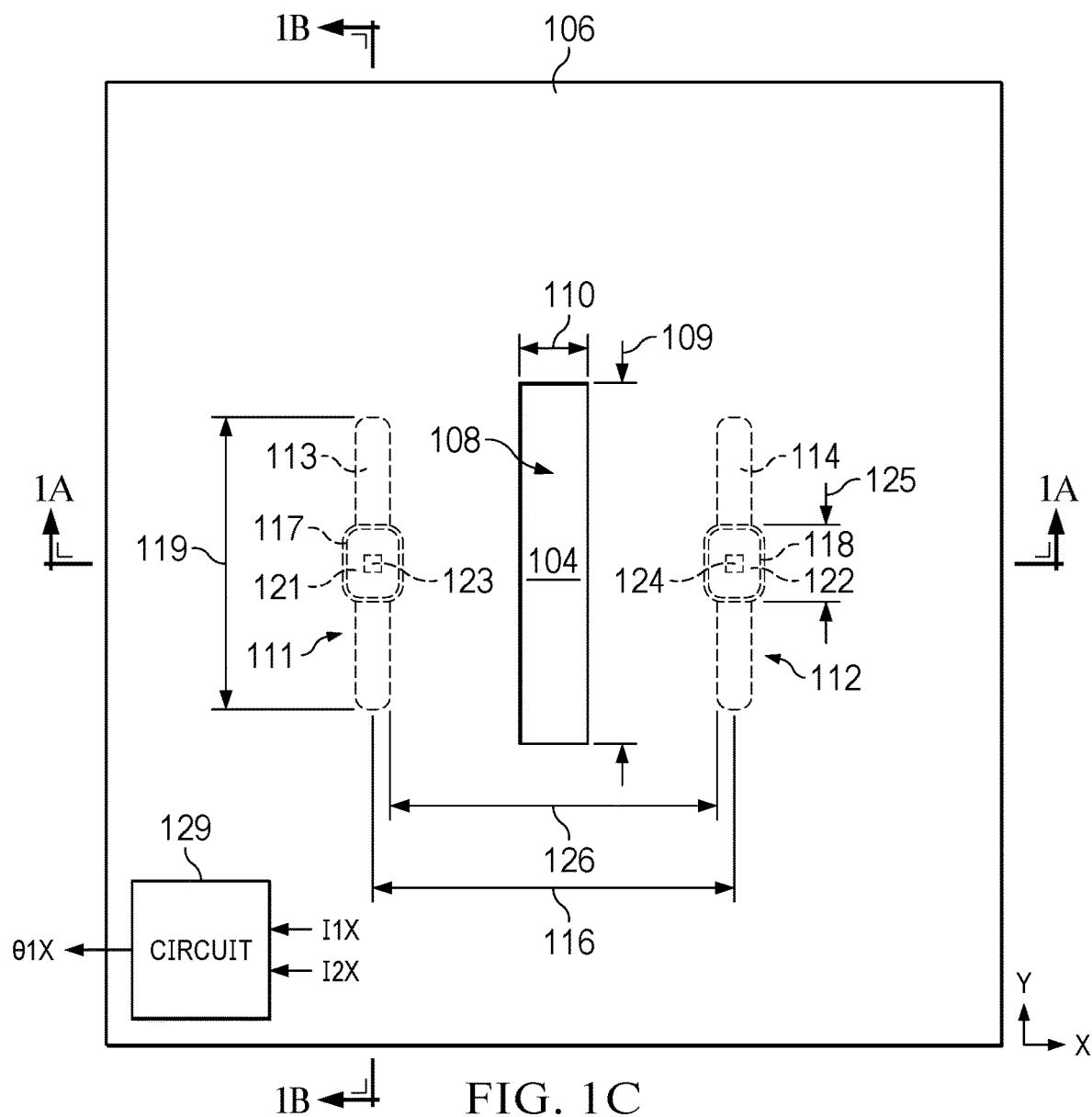
FIG. 1C is a top view of the optical angle sensor of FIG. 1.
Figure 1D:
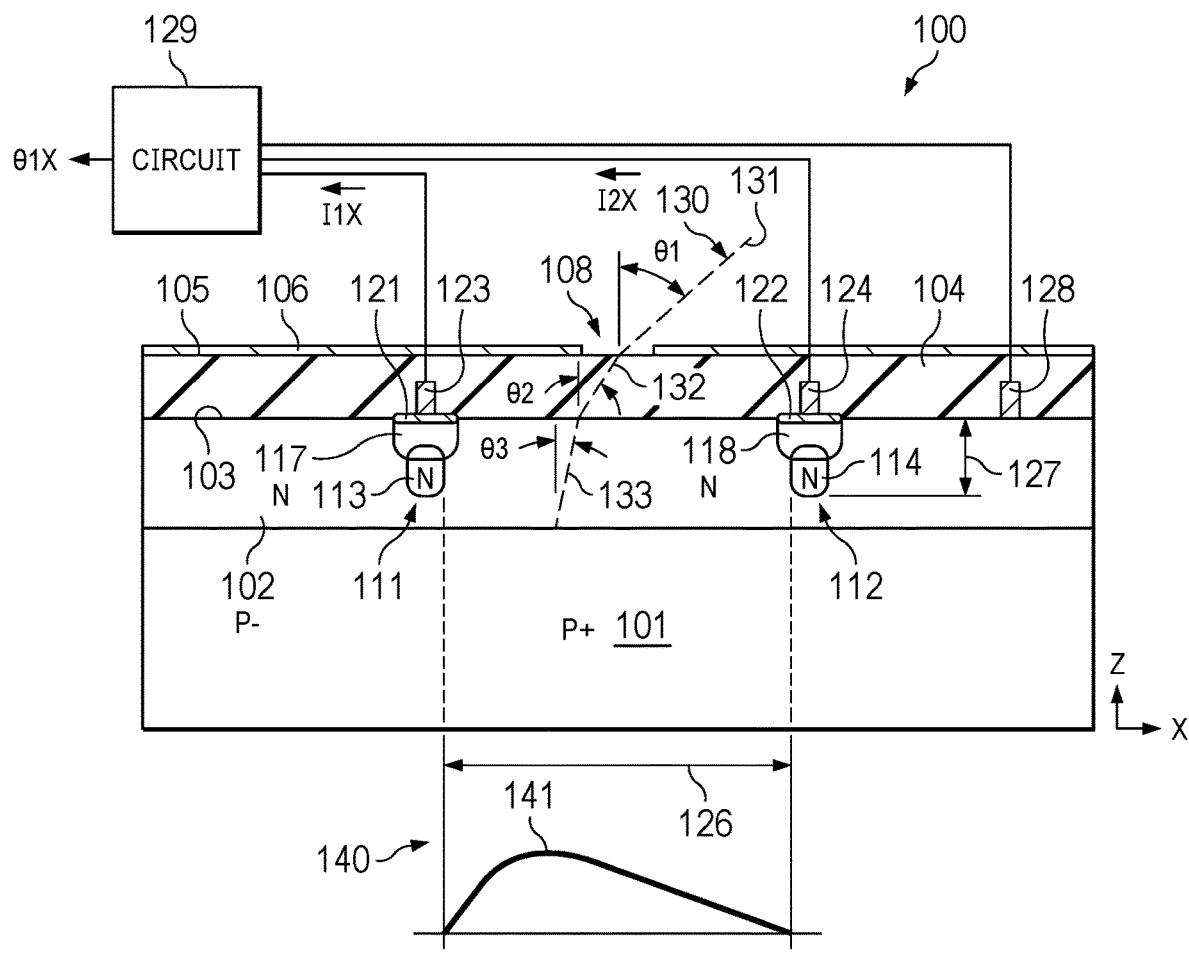
FIG. 1D is a sectional end view of the optical angle sensor of FIG. 1 showing operation with incident light received through the sensor aperture.

Referring initially to FIGS. 1-1D, FIG. 1 shows an electronic device having an optical angle sensor 100. The optical angle sensor 100 may be referred to without implied limitation as a "one-dimensional" optical angle sensor. The optical angle sensor 100 has an elongated rectangular sensor aperture in an on-chip metal cover layer to collimate incoming light and two longitudinal cathodes of a photodiode sense an optical angle in one dimension for improved linear performance across a wide field of view. FIG. 1A shows a sectional view of the optical angle sensor 100 taken along line 1A-1A of FIG. 1, FIG. 1B shows a sectional side view of the optical angle sensor 100 taken along line 1B-1B of FIG. 1, FIG. 1C shows a top view of the optical angle sensor 100, and FIG. 1D shows operation of the optical angle sensor 100 with incident light received through the sensor aperture. The optical angle sensor 100 includes a doped semiconductor surface layer with laterally spaced apart and elongated cathodes having oppositely-doped buried cathode portions and shorter contact portions extending from the respective buried cathode portions to the top side of the semiconductor surface layer, with an anode electrical connection to a substrate. The optical angle sensor 100 has a dielectric layer over the top side of the semiconductor surface layer.

A metal cover layer extends over the dielectric layer opposite the semiconductor surface layer and includes a rectangular aperture in the on-chip metal whose aperture width is less than the lateral separation of the cathodes, with the depth of field of the sensor less than the cathode separation to collimate light without a lens or other optics. The rectangular aperture has four sides to collimate incident light onto an anode region of the semiconductor surface layer extending laterally between the cathodes. Herein "rectangular" as used to describe an aperture means the aperture has four sides and includes squares (all sides having a same length) and "elongated" rectangles (one pair of opposite sides is longer than the other pair of opposite sides). An aperture may have rounded corners and still be regarded as rectangular. An elongated rectangular aperture has a major axis parallel to the longer sides and a minor axis parallel to the shorter sides. A square aperture has a first axis parallel to one pair of opposite sides and a second axis parallel to the other pair of opposite sides.

The sensor 100 of FIGS. 1-1D includes an elongated rectangular opening, or "aperture", exposing a moderately p-doped anode portion of a semiconductor surface layer between two buried n-doped cathodes located along and offset from the long aperture edges. In another implementation (not shown), the surface layer is n-doped and provides a cathode of the photodiode while p-buried regions provide anodes. The individual cathodes in FIGS. 1-1D include a buried stripe of n-type doped semiconductor, or n-buried layer (NBL), with an n-type "sinker" or well region, sometimes referred to as a deep well, or when n-type a DEEPN well, that connects it to the surface by a smaller portion of the cathode's total area, so that it can be electrically connected to sensing circuitry. Other implementations can have a p-type semiconductor substrate or surface layer with at least two n-type cathodes, a metal layer with a square or rectangular aperture whose dimensions are greater than the depth of the cathodes, and one or more anode connections that are electrically in contact with the substrate or surface layer. The cathodes are disposed along the edges or sides of the aperture, set back away from the aperture sides by a non-zero distance relative to the aperture edge, such that the metal layer covers the cathodes, shadowing them from exposure to incoming light. The elongated buried portions of the cathodes in certain examples increase the photocurrent collection efficiency and amplify the signal, and the n-type sinker (top contact) portions of the respective cathodes have a smaller cross-sectional area to reduce electrical noise that would otherwise reduce the signal-to-noise ratio (SNR) of the sensor.

The optical angle sensor 100 in FIGS. 1-1D has a semiconductor substrate 101, for example, heavily doped silicon, e.g. degenerately doped, of a starting silicon or SOI wafer having majority carrier dopants of a first conductivity type and a first average dopant concentration. Degenerate doping with respect to a semiconductor feature means the semiconductor has a sufficient doping concentration that semiconductor exhibits metallic characteristics, e.g., the dependence of conductivity on temperature is reduced. For example, a dopant concentration greater than about 1E18 $cm^{-3}$ in silicon results in degenerate doping, which may also be referred to as "heavily doped". At or below a dopant concentration of 1E18 $cm^{-3}$ may be referred to as "non-degenerately doped" The semiconductor material for the semiconductor substrate 101 may be single-crystal Si, but the material may include other type of materials, such as Ge, SiGe, GaAs, InAs, SiGeC, GaN, or SiC. In the illustrated example, the first conductive type is p-type, and an opposite second conductive type is n-type. While examples herein may be described for cases in which the first conductive type is p-type and the second conductive type is n-type, those skilled in the pertinent art will recognize that analogous examples may be implemented with the conductivity types reversed. The optical angle sensor 100 also includes a semiconductor surface layer 102 that has majority carrier dopants of the first conductivity type (e.g., p-type) and a generally planar top side 103 that extends in a plane of orthogonal first and second directions X and Y, respectively. In one example, the semiconductor surface layer 102 is an epitaxial layer, such as epitaxial silicon, and may have a thickness of about 20 µm. The semiconductor surface layer 102 has a second average dopant concentration that is less than the first average dopant concentration of the substrate 101 and is non-degenerately doped. In various examples the semiconductor surface layer 102 has a dopant concentration, e.g., of boron, in a range from 1E13 $cm^{-3}$ to 1E17 $cm^3$.

A dielectric layer 104 (e.g., $SiO_2$) extends over (e.g., above or directly on) the top side 103 of the semiconductor surface layer 102, and in some examples may have a thickness of about 10 µm. The dielectric layer 104 has a top side 105, and a metal layer 106 extends over (e.g., above or directly on) the top side 105 of the dielectric layer 104 opposite the semiconductor surface layer 102. Candidate materials for the metal layer 106 include, but are not limited to Al, Cu, Ti, TiN, Pt, W, Ta, TaN and combinations or alloys thereof. The metal layer 106 includes a rectangular aperture 108 with four substantially straight sides. The example aperture 108 of FIGS. 1-1D has an elongated rectangular shape with an aperture length 109 along the second direction Y and an aperture width 110 along the first direction X. The optical angle sensor 100 also includes a first cathode 111 and a second cathode 112 of a photodiode. The cathodes 111 and 112 are formed in the semiconductor surface layer 102 and have majority carrier dopants of the second conductivity type (e.g. n-type). The cathodes 111 and 112 are elongated along the second direction Y and are laterally spaced apart from one another along the first direction X. In operation, the aperture 108 collimates incident light onto an anode region of the semiconductor surface layer 102 that extends laterally along the first direction X between the cathodes 111 and 112.

As shown in FIG. 1A, the laterally spaced apart and elongated cathodes 111 and 112 include elongated and heavily n-doped buried cathode portions 113 and 114 implanted at an average depth 115 below the top side 103 of the semiconductor surface layer 102 and the tops of the buried cathode portions 113 and 114 are vertically spaced apart from the top side 103 of the semiconductor surface layer 102 along a third direction Z that is orthogonal to the first and second directions X and Y. In some examples the buried cathode portions 113 and 114 are formed from an n-type dopant such as arsenic or antimony implanted to an average depth 115 of about 4 µm, which may be in a range from about 4 µm to about 15 µm. The final extent of the buried cathode portions 113 and 114 is determined in part by diffusion of the implanted dopant after annealing. The buried cathode portions 113 and 114 may have a thickness (Z-direction) of at least about 2 µm and have degenerate doping of at least about 1E19 $cm^{-3}$. The buried cathode portions 113 and 114 are formed such that a portion of the semiconductor surface layer 102 is located between the top side 103 and the buried cathode portions 113 and 114, and thus may be referred to as a "buried layer" or "buried region". In various examples the depth of the top sides of the buried cathode portions 113 and 114 is located about 10 µm below the top side 103 and may be in a range of 4 µm to 10 µm. Without limitation by theory, it is believed that spacing the buried cathode portions 113 and 114 apart from the top side 103 reduces effects such as interface recombination and trap noise that would otherwise reduce the detected signal and/or increase the SNR. In addition, the centers of the buried cathode portions 113 and 114 are laterally apart spaced by a distance 116 along the first direction X. In some examples the distance 116 is in a range from about 10 µm to about 250 µm, e.g., about 75 µm. The cathodes 111 and 112 also include shorter, heavily (degenerately) doped diode contact portions 117 and 118, respectively, which may be referred to as cathode contact portions 117 and 118 in the context of the illustrated example. The cathode contact portions 117 and 118 extend from the top side 103 to the respective buried cathode portion 113, 114. The cathode contact portions 117 and 118 have majority carrier dopants of the second conductivity type (e.g., an n-type dopant) and are degenerately doped with dopant concentration of at least 1E19 $cm^{-3}$. In some examples, optional diode well regions 135 having the first conductivity type (e.g., p-type) and extending from the top side 103 into the semiconductor surface layer 102 are located where the cathode contact portions 117, 118 are not otherwise located. The diode well regions 135 may be non-degenerately doped with a dopant concentration greater than the semiconductor surface layer 102 and may be formed by implanting boron to a dose of 1E12 $cm^{-3}$ with an energy of 200 keV, resulting in a depth of about 1 µm. The diode well regions 135 may be formed by default in a particular process technology used to form the optical angle sensor 100.

In some examples the aperture length 109 is about 125 µm and the aperture width 110 is about 50 µm, though there are no particular limitations on the dimensions, though such dimensions may be constrained by other features of the optical angle sensor 100. At the low end, the length and width of the aperture may be limited by diffraction of the light being detected. Thus, in some examples the smallest dimension of the aperture 108 is no smaller than about 10× the longest wavelength of light to be sensed. For example, if red light with a wavelength of 750 nm is the longest wavelength to be sensed, the smallest aperture dimension, e.g., the width 110, may be about 7.5 µm. At the high end, the aperture length may be as long as the pitch of an array of the optical angle sensors 100 (described below), e.g., about 500 µm. In such arrays, each optical angle sensor 100 occupies a unit cell of the array. In some examples the area of the aperture 108, e.g., length 109 times width 110, is in a range from about 2% of the area occupied by the unit cell to about 50% of the unit cell area, depending on the selection of other device parameters. The aperture width 110 may range up to about 250 µm, occupying up to about 50% of the unit cell area. In various examples, the aperture width 110 is less than the distance 116, and the aperture is about centered between the cathodes 111 and 112, such that each of the cathodes 111 and 112 is directly between the metal layer 106 and the substrate 101. In various examples the distance 116 is about 10 µm greater than the aperture width 110, such that the metal layer 106 overlaps the cathodes 111 and 112 by about 5 µm. In other examples the minimum overlap may be 1 µm, and the maximum overlap may be about 50 µm (the distance 116 is 100 µm greater than the aperture width 110). A greater overlap is thought to result in insufficient minority carrier flow to the cathodes 111, 112.

As shown in FIG. 1B, the buried cathode portions 113 and 114 are elongated and have a buried portion length 119 along the second direction Y. The cathode contact portions 117 and 118 are smaller, and have a contact portion length 125 that is less than the buried portion lengths 119 along the second direction Y. In the illustrated example, the buried portion length 119 is less than the aperture length 109, although not a requirement of all possible implementations. In some examples the buried portion length 119 is about equal to or greater than the aperture length 109, for example about 125 µm when the aperture length is 125 µm. In other examples the buried portion length 119 may be in a range from 1 µm to 500 µm, depending on other device parameters. The width of the buried cathode portions 113 and 114 (unreferenced) may be as small as technology design rules allow, e.g., about 2 µm, this width is not limited to any particular value other than not extending past the unit cell area in an array of optical angle sensors 100, but a practical maximum may be about 10 µm. The cathode contact portions 117 and 118 may be formed by implantation with a maximum depth 120 below the top side 103 of the semiconductor surface layer 102 along the third direction Z and extend from the top side 103 of the semiconductor surface layer 102 to the respective buried cathode portions 113 and 114. In some examples the cathode contact portions 117 and 118 are formed by implanting phosphorous to a maximum depth 120 sufficient to respectively overlap the cathode portions 113, 114. In some examples the maximum depth 120 is about 4 µm and may be in a range from about 4 µm to about 15 µm. The contact portion length 125 may be any value consistent with technology design rules, e.g., in a range from 4 µm to 10 µm, and the (unreferenced) width of the cathode contact portions 117 and 118 may be same as the width of the buried cathode portions 113 and 114, e.g., in a range from 2 µm to 10 µm. The final extent of the cathode contact portions 117 and 118 will be determined in part by diffusion of the dopant in a subsequent thermal anneal step. The aperture 108 is located over a portion of the semiconductor surface layer 102 that forms an anode of the photodiode between the first and second cathode contact portions 117 and 118 along the first direction X. The cathodes 111 and 112 are under and shadowed by the metal layer 106 along the third direction Z, where the first cathode contact portion 117 faces a first portion of the metal layer 106 along the third direction Z and the second cathode contact portion 118 faces a second portion of the metal layer 106 along the third direction Z.

As shown in FIGS. 1A and 1B, a first cathode contact metal structure 121 extends on a top side of the first cathode contact portion 117 and a second cathode contact metal structure 122 extends on a top side of the second cathode contact portion 118. A first electrode 123 extends upward along the third direction Z from the first cathode contact metal structure 121 for electrically coupling the first cathode 111 to a sensing circuit (e.g., 129 in FIG. 1D) and a second electrode 124 extends upward along the third direction Z from the second cathode contact metal structure 122 for electrically coupling the second cathode 112 to the sensing circuit 129. In one example, the dielectric layer 104 includes conductive routing structures or metallization trace layers to provide electrical interconnection of the cathodes 111 and 112. As shown in FIGS. 1C and 1D, moreover, the conductive routing structures or metallization trace layers include an anode electrode 128 and an unreferenced anode contact metal structure. that electrically couples the photodiode anode of the p-doped semiconductor surface layer 102 to the sensing circuit 129. In one example, the sensing circuit 129 includes circuit components (e.g., transistors, diodes, resistors, etc., not shown) formed on or in the semiconductor surface layer of the optical angle sensor device 100 (e.g., on-chip) to form a circuit that generates or otherwise provides a signal or value representing an incident light angle along the first direction X based on a difference in current of the first and second cathodes 111 and 112, such as a percentage of the total photocurrent which is steered to one or the other cathode. In another implementation, the sensing circuit 129 is external to the optical angle sensor device 100 and the optical angle sensor device 100 includes conductive terminals (e.g., copper or aluminum bond pads, not shown) to allow electrical connection of the n-doped photodiode cathodes 111 and 112 and the p-doped anode of the semiconductor surface layer 102 to the circuit, for example, via bond wires, flip-chip solder connections, etc.

The semiconductor substrate 101 has a first average dopant concentration of the majority carriers of the first type (e.g., p). The photodiode is formed over the semiconductor substrate 101 and includes the semiconductor surface layer 102 that extends over the semiconductor substrate 101. The first cathode 111 has majority carrier dopants of the second conductivity type (e.g., n-type). The second cathode 112 extends in the semiconductor surface layer 102 and has majority carrier dopants of the second conductivity type (e.g., n-type).

As shown in FIGS. 1A and 1B, the first cathode 111 and the second cathode 112 extend in the semiconductor surface layer 102 to a cathode depth 127 from the top side 103 of the semiconductor surface layer 102 along the third direction Z, where the respective first and second buried portions 113 and 114 extend to the cathode depth 127 along the third direction Z. In the illustrated example, the second cathode 112 is spaced apart from the first cathode 111 along the first direction X by a separation distance 126 that is greater than the aperture width 110. In some examples the separation distance 126 may be about 10-250 µm. In addition, the cathode depth 127 is less than the aperture width 110 and length 109. As discussed above, the aperture 108 in this example has an elongated rectangular shape, in which the aperture width 110 along the first direction X is less than the aperture length 109.

In the illustrated example, the first buried portion 113 has a first buried portion average dopant concentration and the first cathode contact portion 117 has a first contact portion average dopant concentration may be greater than the first buried portion average dopant concentration. The second buried cathode portion 114 in this example has a second buried portion average dopant concentration and the second cathode contact portion 118 has a second contact portion average dopant concentration that may be greater than the second buried portion average dopant concentration. In addition, the second average dopant concentration of the semiconductor surface layer 102 is less than the first buried portion average dopant concentration and the second average dopant concentration of the semiconductor surface layer 102 is less than the first contact portion average dopant concentration. The second average dopant concentration of the semiconductor surface layer 102 in this example is less than the second buried portion average dopant concentration and the second average dopant concentration of the semiconductor surface layer 102 is less than the second contact portion average dopant concentration.

FIG. 1D illustrates schematic connections of the photodiode anode and cathodes to sensing circuit 129 and further shows incident light 130 received through the sensor aperture 108. The light 130 has a first portion 131 that enters the aperture 108 at a non-zero first or input angle $\theta_1$. The SiO$_2$ of the dielectric layer 104 acts as a refracting spacer layer to change the light angle to a second angle $\theta 2$ along a second portion 132 of the light 130 in the dielectric layer 104. The light 130 has a third portion 133 in the anode or active portion of the semiconductor surface layer 102 between the cathodes 111 and 112. The incident light causes a photoresponse on the photodiode, in which the p-type semiconductor surface layer 102 generates electron-hole pairs. The electrons generated in the p-type semiconductor surface layer 102 are minority carriers and the generated electrons may diffuse to the cathodes 111 and 112 and be collected by the sensing circuit 129 as photocurrent via the electrodes 123 and 124. FIG. 1D also shows a graph 140 with photocurrent distribution 141 that represents the resulting photocurrent density in the semiconductor surface layer 102 along the first direction X between the cathodes 111 and 112. For the illustrated example in which the longitudinal aperture length 109 and lateral width 110 are greater than the cathode depth 127 of the cathodes 111 and 112, the graph 140 shows the photocurrent distribution 141 between the two cathodes 111 and 112 for the illustrated non-zero incident angle $\theta_1$ of the light 130. The position at which the light impinges on the semiconductor surface layer 102 determines how much current is received by the respective first (e.g., left) and second (e.g., right) cathodes 111 and 112. The circuit 129 in one example provides a signal or value $\theta_{1X}$ representing the incident light angle $\theta_1$ along the first direction X based on the difference in current of the first and second cathodes 111 and 112, such as a percentage of the total photocurrent that flows to each of the cathodes 111, 112. In this or another example, the sensing circuit 129 provides output signals or values $I_{1X}$ and $I_{2X}$ representing the currents of the respective first and second cathodes 111 and 112. In this example, the sensing circuit 129 generates the optical angle estimate output signal or value $\theta_{1X}$ as $\Sigma=(I_{signal}/I_{total})=(I_{1X}-I_{2X})/(I_{1X}+I_{2X})=CONST*\theta_1$, where the constant CONST depends on the layout dimensions and incident wavelength of the light 130, $I_{1X}$ is the current of the first cathode 111 and $I_{2X}$ is the current of the second cathode 112.

The example optical angle sensor 100 of FIGS. 1-1D provides angle sensing in one dimension along the first direction X in the illustrated orientation with substantially linear performance over a wide angular range. The wide field of view performance is enhanced by the elongated rectangular aperture 108 that provides a virtually infinite depth-of-field and is free of distortions and aberrations associated with light rays far off the optical axis of a lens or mirror system. Moreover, the optical angle sensor 100 does not require a lens or other optical components. The optical angle sensor 100 allows the light 130 to pass through the $SiO_2$ of the dielectric layer 104 and into the anode region of the semiconductor surface layer 102. This converts a large incident angle $\theta_1$ to a significantly smaller refraction angle $\theta_3$ in the anode. In one example, calculations show an 80° incident angle may be refracted by 16°, and the structure allows the optical angle sensor 100 to sense wide incident angles with small lateral diffusion lengths. In the example optical angle sensor 100, moreover, the displacement of the image from the centerline is equal or smaller than the cathode separation distance 126 to avoid or mitigate output signal nonlinearity caused by light directly hitting the cathodes 111 or 112. The optical angle sensor 100 uses all or substantially all the collected light to determine the average position of a light source or tracked object without requiring a lens, a digital camera or a digital processor.

Figure 2:
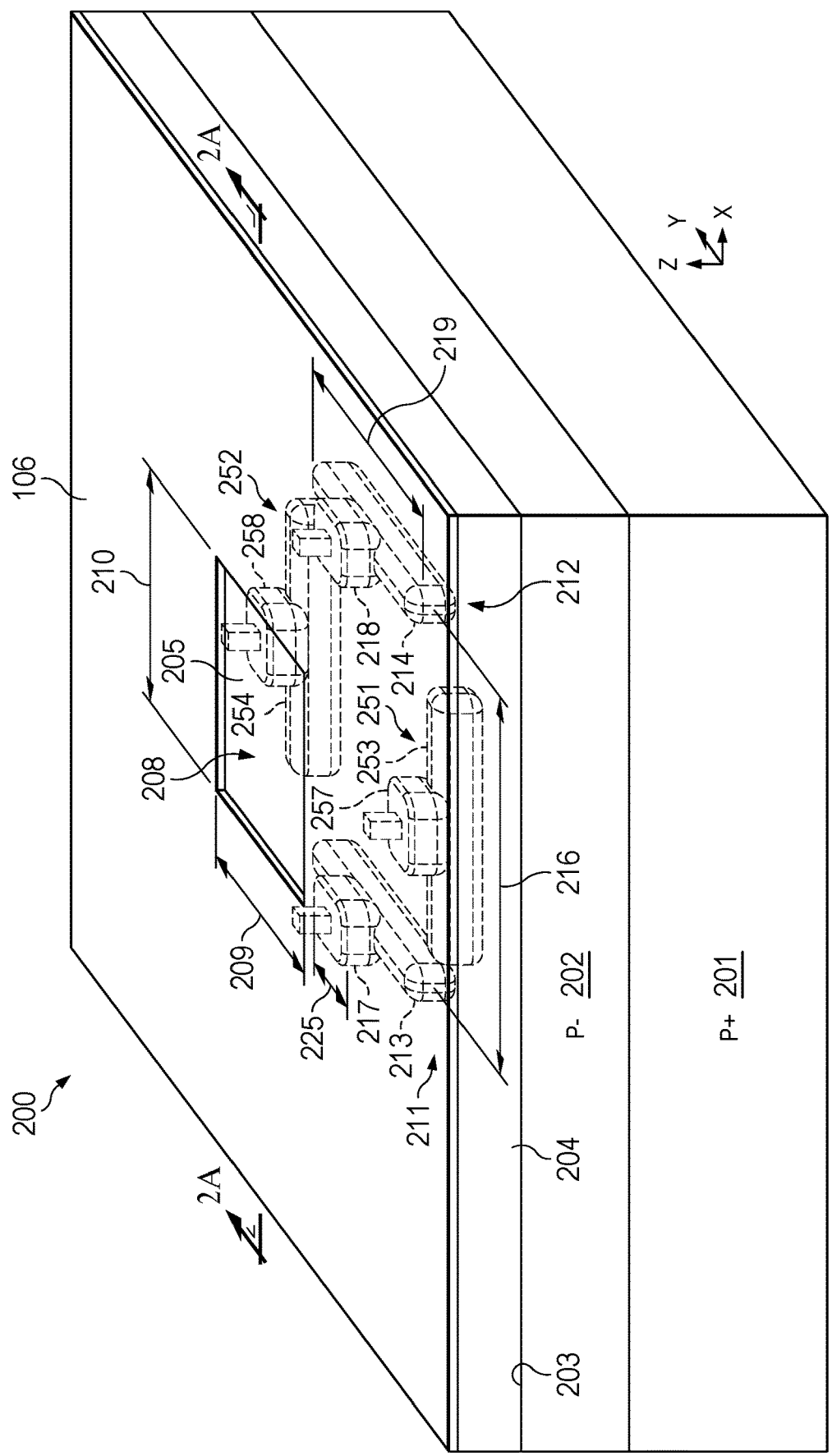
FIG. 2 is a perspective view of another optical angle sensor electronic device having a square sensor aperture and four cathodes for sensing optical angle in two dimensions.
Figure 2A:
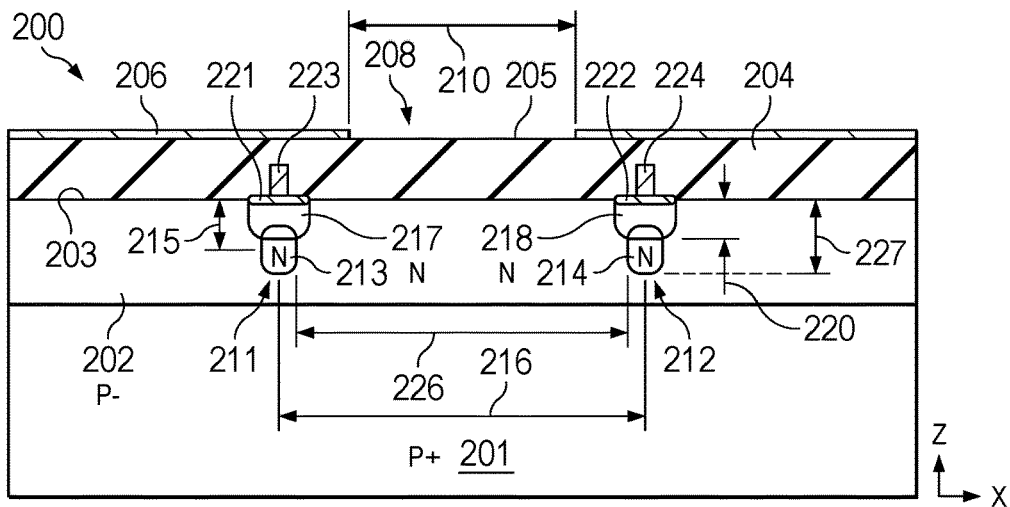
FIG. 2A is a sectional end view of the optical angle sensor taken along line 2A-2A of FIG. 2.
Figure 2B:
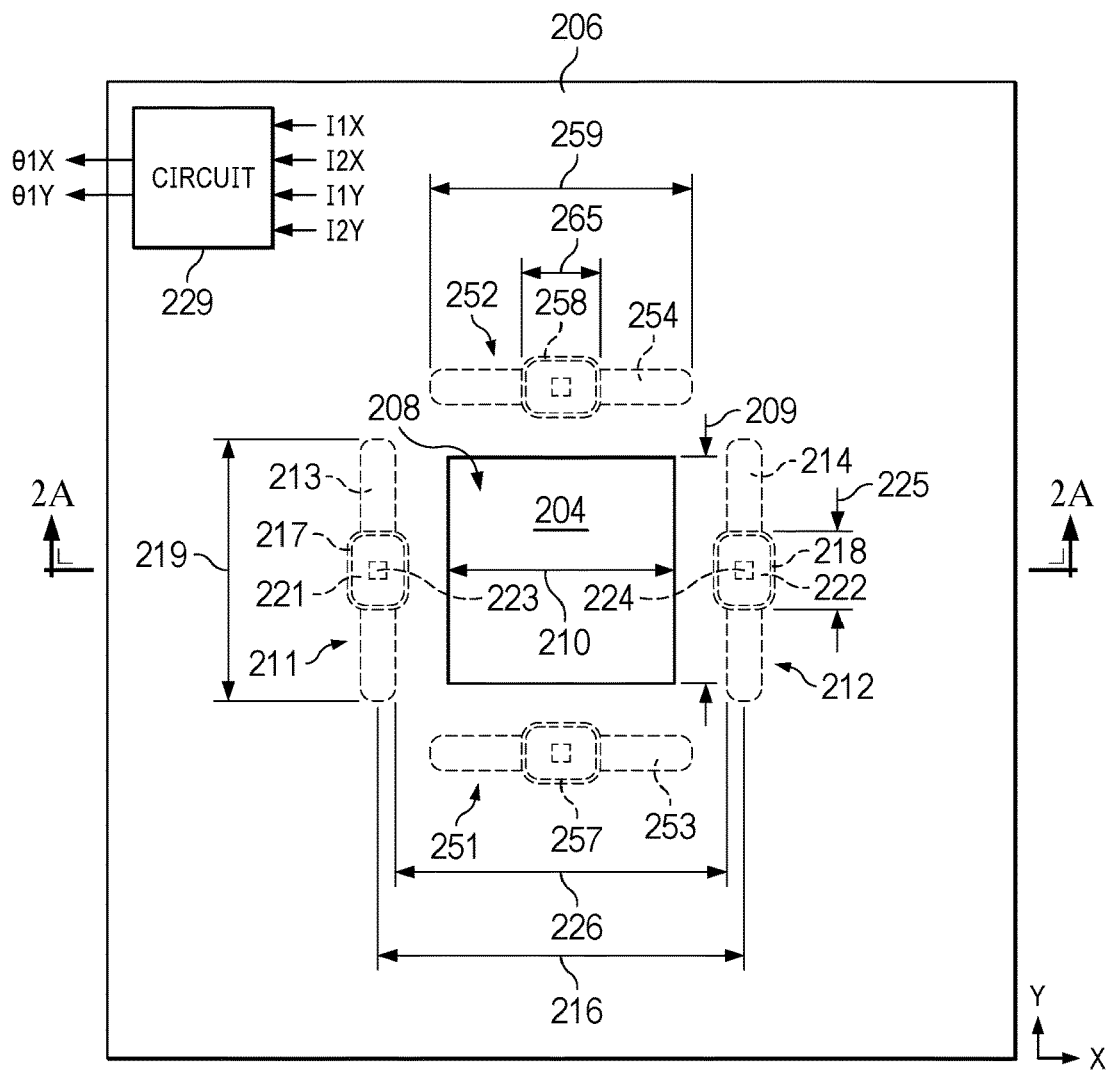
FIG. 2B is a top view of the electronic device of FIG. 2.

FIGS. 2-2B show another optical angle sensor 200 having a square sensor aperture and four cathodes for sensing optical angle in two dimensions along the first direction X and/or along the second direction Y. The optical angle sensor 200 may be referred to without implied limitation as a "two-dimensional" optical angle sensor. FIG. 2A shows the optical angle sensor 200 taken along line 2A-2A of FIG. 2 and FIG. 2B shows a top view of the optical angle sensor 200. The optical angle sensor 200 in FIGS. 2-2B has a semiconductor substrate 201, for example, heavily doped silicon of a starting silicon or SOI wafer having majority carrier dopants of the first conductivity type (e.g., p) and a first average dopant concentration. The semiconductor material for the semiconductor substrate 201 may be single-crystal Si, but the material may include other type of materials, such as Ge, SiGe, GaAs, InAs, SiGeC, GaN, or SiC. In the illustrated example, the first conductive type is p-type, and an opposite second conductive type is n-type. The optical angle sensor 200 also includes a semiconductor surface layer 202 that has majority carrier dopants of the first conductivity type (e.g., p-type) and a generally planar top side 203 that extends in a plane of the first and second directions X and Y, respectively. In one example, the semiconductor surface layer 202 is an epitaxial layer, such as epitaxial silicon. The semiconductor surface layer 202 has a second average dopant concentration that is less than the first average dopant concentration of the substrate 201.

A dielectric layer 204 (e.g., $SiO_2$) extends over (e.g., above or directly on) the top side 203 of the semiconductor surface layer 202. The dielectric layer 204 has a top side 205, and a metal layer 206 extends over (e.g., above or directly on) the top side 205 of the dielectric layer 204 opposite the semiconductor surface layer 202. Candidate materials for the metal layer 206 include, but are not limited to Al, Cu, Ti, TiN, Pt, W, Ta, TaN, and combinations or alloys thereof. The metal layer 206 includes a rectangular aperture 208 with a square shape having four substantially straight and substantially equal sides. The example aperture 208 of FIGS. 2-2B has an aperture length 209 along the second direction Y and a substantially equal aperture width 210 along the first direction X. In some examples the aperture length 209 and the aperture width 210 are in a range from about 30 μm and about 300 μm, e.g., about 75 μm.

The optical angle sensor 200 includes a first cathode 211 and a second cathode 212 of a photodiode for sensing optical angle along the first direction X. As shown in FIGS. 2 and 2B, the optical angle sensor 200 also includes a third cathode 251 and a fourth cathode 252 of the photodiode for sensing optical angle along the second direction Y. Unless otherwise described, the cathodes 211, 212, 251 and 252 may be formed in a similar manner and have dimensional characteristics as described for the cathodes 111 and 112. The cathodes 211, 212, 251, and 252 are formed in the semiconductor surface layer 202 and have majority carrier dopants of the second conductivity type (e.g. n-type). The first and second cathodes 211 and 212 are elongated along the second direction Y and are laterally spaced apart from one another along the first direction X. The third and fourth cathodes 251 and 252 are elongated along the first direction X and are laterally spaced apart from one another along the second direction Y. In operation, the aperture 208 collimates incident light onto an anode region of the semiconductor surface layer 202 that extends laterally along the first direction X between the cathodes 211 and 212 and along the second direction Y between the cathodes 251 and 252.

As shown in FIG. 2A, the laterally spaced apart and elongated cathodes 211 and 212 include elongated and heavily n-doped buried cathode portions 213 and 214 formed at an average depth 215 below the top side 203 of the semiconductor surface layer 202 and the tops of the buried cathode portions 213 and 214 are vertically spaced apart from the top side 203 of the semiconductor surface layer 202 along the third direction Z. In some examples the buried cathode portions 213 and 214 are formed from antimony implanted with sufficient dose and energy to be degenerately doped with a concentration of at least 1E19 $cm^{-3}$ and have an average depth 215 of about 4 μm. In addition, the centers of the buried cathode portions 213 and 214 are laterally spaced apart by a distance 216 along the first direction X. The cathodes 211 and 212 also include shorter, heavily n-doped first and second cathode contact portions 217 and 218, respectively. The cathode portions 213, 214, 217 and 218 have majority carrier dopants of the second conductivity type (e.g., n). The third and fourth cathodes 251 and 252 include respective elongated and heavily n-doped third and fourth buried cathode portions 253 and 254 implanted at the same average depth 215 below the top side 203 of the semiconductor surface layer 202. The tops of the third and fourth buried cathode portions 253 and 254 are spaced apart from the top side 203 of the semiconductor surface layer 202 along the third direction Z. In addition, the centers of the third and fourth buried cathode portions 253 and 254 are laterally spaced apart by a distance along the second direction Y (e.g., substantially equal to the distance 216). The cathodes 251 and 252 also include shorter, heavily n-doped third and fourth cathode contact portions 257 and 258, respectively. The cathode portions 253, 254, 257 and 258 have majority carrier dopants of the second conductivity type (e.g., n). Well regions, not shown, may be present similar to the well regions 135 (FIG. 1A).

As shown in FIG. 2B, the first and second buried cathode portions 213 and 214 are elongated and have a buried portion length 219 along the second direction Y. The third and fourth buried cathode portions 253 and 254 are elongated and have a buried portion length 259 along the first direction X, which may be substantially equal to the length 219. In various examples the buried portion length 219 is about the same length as the aperture length 209 and aperture width 210. In some examples the buried portion length 219 is less than the aperture length 209 and aperture width 210 so ensure sufficient distance between nearest neighbor buried cathode portions that buried cathode portions 213, 214, 253 and 254 operate independently. In some examples a distance of about 10 µm between ends of nearest neighbor buried cathode portions may be provided. In some examples the buried portion length 219 is in a range from about 30 µm and about 300 µm, e.g. about 75 µm. The first and second cathode contact portions 217 and 218 are smaller, and have contact portion lengths 225 that are less than the buried portion lengths 219 along the second direction Y. The third and fourth cathode contact portions 257 and 258 have contact portion lengths 265 that are less than the buried portion lengths 259 along the first direction X (e.g., substantially equal to the length 225). The buried portion lengths 219 and 259 are greater than the aperture length 209 and the buried portion lengths 219 and 259 are greater than the aperture width 210, although not a requirement of all possible implementations. The cathode contact portions 217, 218, 257, and 258 are implanted to an average depth 220 below the top side 203 of the semiconductor surface layer 202 along the third direction Z and extend from the top side 203 of the semiconductor surface layer 202 to the respective buried portion portions 213, 214, 253, and 254.

The square aperture 208 is located over a portion of the semiconductor surface layer 202 that forms an anode of the photodiode between the first and second contact portions 217 and 218 along the first direction X and between the third and fourth contact portions 257 and 258 along the second direction Y. The cathodes 211, 212, 251, and 252 are under and shadowed by the metal layer 206 along the third direction Z, where the first contact portion 217 faces a first portion of the metal layer 206 along the third direction Z, the second contact portion 218 faces a second portion of the metal layer 206 along the third direction Z, the third contact portion 257 faces a third portion of the metal layer 206 along the third direction Z, and the fourth contact portion 258 faces a fourth portion of the metal layer 206 along the third direction Z.

The optical angle sensor 200 in one example includes contact metal structures (e.g., tungsten, etc.) and electrodes (not shown) for signal connection of the cathodes 211, 212, 251, and 252 and of the anode of the semiconductor surface layer 202 to a sensing circuit 229 as schematically shown in FIG. 2B, for example, by conductive routing structures or metallization trace layers in the dielectric layer 204. As shown in FIGS. 2A and 2B, a first cathode contact metal structure 221 extends on a top side of the first cathode contact portion 217 and a second cathode contact metal structure 222 extends on a top side of the second cathode contact portion 218. A first electrode 223 extends upward along the third direction Z from the first cathode contact metal structure 221 for electrically coupling the first cathode 211 to a sensing circuit (229 in FIG. 2D) and a second electrode 224 extends upward along the third direction Z from the second cathode contact metal structure 222 for electrically coupling the second cathode 212 to the sensing circuit 229. In one example, the sensing circuit 229 includes circuit components (e.g., transistors, diodes, resistors, etc., not shown) formed on or in the semiconductor surface layer 202 to form a circuit that generates or otherwise provides a signal or value $\theta_{1X}$ representing an incident light angle along the first direction X based on a difference in current of the first and second cathodes 211 and 212 (e.g., a percentage of the total photocurrent which is steered to one or the other cathode), as well as a signal or value $\theta_{1Y}$ representing an incident light angle along the second direction Y based on a difference in current of the third and fourth cathodes 251 and 252 (e.g., a percentage of the total photocurrent which is steered to one or the other cathode). In another implementation, the sensing circuit 229 is external to the optical angle sensor device 200 and the optical angle sensor device 200 includes conductive terminals (e.g., copper or aluminum bond pads, not shown) to allow electrical connection of the n-doped photodiode cathodes 211, 212, 251, and 252 and the p-doped anode of the semiconductor surface layer 202 to the sensing circuit 229, for example, via bond wires, flip-chip solder connections, etc.

As shown in FIG. 2A the cathodes 211, 212, 251, and 252 extend in the semiconductor surface layer 202 to a cathode depth 227 from the top side 203 of the semiconductor surface layer 202 along the third direction Z. The buried portions 213, 214, 253, and 254 extend to the cathode depth 227 along the third direction Z. In the illustrated example, the second cathode 212 is spaced apart from the first cathode 211 along the first direction X by the spacing distance 226 that is greater than the aperture width 210 and greater than the aperture length 209. The third and fourth cathodes 251 and 252 are spaced apart from one another along the second direction Y by the same distance, which is greater than the aperture length 209 and width 210. The cathode depth 227 is less than the aperture width 210 and are less than the aperture length 209. In the illustrated example, the buried portions 213, 214, 253, and 254 have buried portion average dopant concentrations and the contact portions 217, 218, 257, and 258 have contact portion average dopant concentrations that are greater than the buried portion average dopant concentrations. In addition, the second average dopant concentration of the semiconductor surface layer 202 is less than the buried portion average dopant concentrations, and the second average dopant concentration of the semiconductor surface layer 202 is less than the contact portion average dopant concentrations.

FIG. 2B shows schematic connections of the photodiode anode and cathodes to the sensing circuit 229. In operation, the sensing circuit 229 provides one or more signals in response to incident light received through the sensor aperture 208 (e.g., light 130 in FIG. 1D above). The incident light enters the aperture 208 at a first or input angle and the SiO$_2$ of the dielectric layer 204 refracts the light to change the light angle to a second angle. The light enters the anode portion of the semiconductor surface layer 202 between the cathodes 211, 212, 251, and 252 and causes a photoresponse on the photodiode, in which the semiconductor surface layer 202, p-type in the present example, generates electron-hole pairs. The electrons generated in the semiconductor surface layer 202 may diffuse to the cathodes 211, 212, 251, and 252 and are collected by the sensing circuit 229 as photocurrent via the associated cathode electrodes (not shown). For each of the first and second directions X and Y, the incident light angle generates a photocurrent density distribution in the semiconductor surface layer 202 along the respective first and second directions X and Y between the cathodes (e.g., graph 140 in FIG. 1D above). In one example, the sensing circuit 229 a signal or value $\theta_{1X}$ representing the incident light angle along the first direction X based on the difference in current of the first and second cathodes 211 and 212 (e.g., a percentage of the total photocurrent which is steered to one or the other cathode), as well as a signal $\theta_{1Y}$ representing the incident light angle along the second direction Y based on the difference in current of the third and fourth cathodes 251 and 252 (e.g., a percentage of the total photocurrent which is steered to one or the other cathode). In this example, the sensing circuit 229 generates the optical angle estimate output signal or value $\theta_{1X}$ as $\Sigma=(I_{signal}/I_{total})=(I_L-I_R)/(I_L+I_R)=CONST*\theta_1$, where the constant CONST depends on the layout dimensions and incident wavelength of the light, $I_L$ is the current of the first cathode 211 and $I_R$ is the current of the second cathode 212. In this or another example, the sensing circuit 229 provides output signals or values $I_{1X}$ and $I_{2X}$ representing the currents of the respective first and second cathodes 211 and 212 and output signals or values $I_{1Y}$ and $I_{2Y}$ representing the currents of the respective third and fourth cathodes 251 and 252. In this example, the sensing circuit 229 generates the optical angle estimate output signal or value $\theta_{1Y}$ as $\Sigma=(I_{signal}/I_{total})=(I_B-I_T)/(I_B+I_T)=CONST*\theta_1$, where the constant CONST depends on the layout dimensions and incident wavelength of the light, $I_B$ is the current of the third cathode 251 and $I_T$ is the current of the fourth cathode 252. This allows angle sensing, position sensing and tracking and other functions in two dimensions (e.g., X-direction and Y-direction in the illustrated sensor orientation).

In the illustrated examples, the structures of the optical angle sensors 100 and 200 facilitate highly linear input angle sensing across a wide angular range. In certain examples, the optical angle sensors 100 and 200 provide linear sensing ranges of +/−50 degrees or more, such as +/−70 degrees or more, as illustrated and described further below in connection with FIGS. 18 and 22. This represents significant range improvement over previous optical angle sensors along with cost and complexity reductions compared with angle sensing systems that rely on use of focusing optics such as a lens and digital cameras and digital processors. In addition, the disclosed examples provide predictable sensor characteristics and layout of the sensor can be predetermined. In specific applications, moreover, fluctuations of the signal/noise can be minimized by increasing the aperture open area.

Referring now to FIGS. 3-6A, various examples implement multiple instances of the optical angle sensor 100 or the optical angle sensor 200 in an array. Such arrays may be implemented in an integrated circuit, whereby signals from the optical angle sensors of the array are electrically combined to provide a cumulative measurement of light angle. When formed as array, each optical angle sensor may be viewed as a unit cell of a 2-D array, with the unit cells repeated at a particular lateral pitch. For example, and without limitation the optical angle sensor 100 or the optical angle sensor 200 may be placed in an array with a 125 μm horizontal and vertical pitch. The pitch may be selected to reduced total area of the array while reducing communication between adjacent optical angle sensors such as by drift of mobile minority charge carriers. While in the present examples a 125 μm pitch may be used, other examples within the scope of the disclosure are not limited to any particular pitch. In some cases, a minimum pitch of 50 μm is sufficient to prevent excessive crosstalk between neighboring optical angle sensors, with a minimum of 75 μm providing added margin. In some cases, the pitch does not exceed 500 μm, as a greater pitch would provide negligible advantage for crosstalk reduction.

Figure 3:
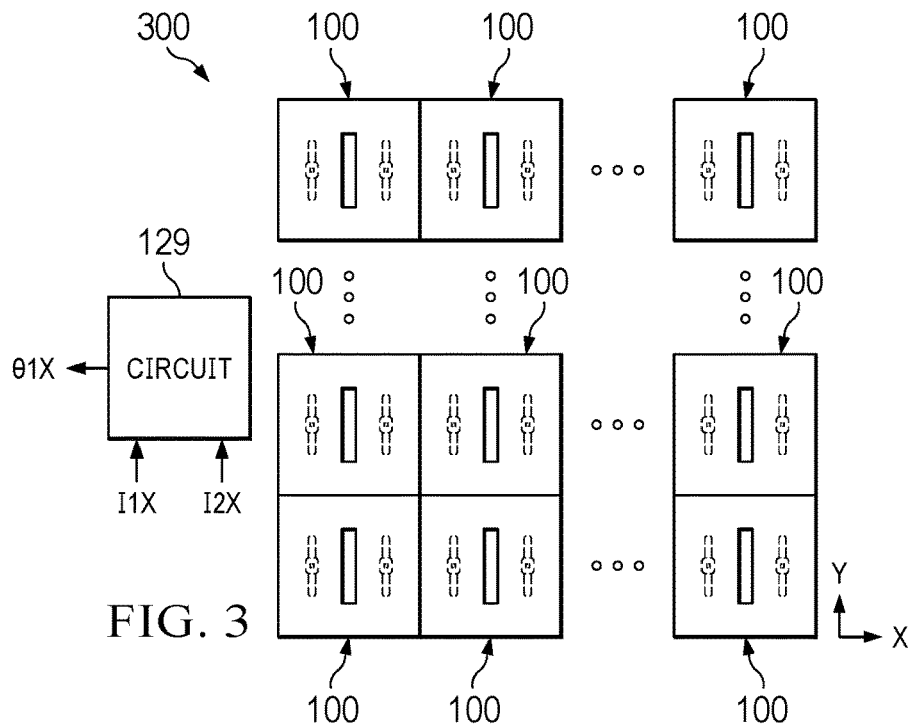
FIG. 3 is a simplified top view of an optical angle sensor electronic device having an array of one-dimensional optical angle sensors aligned with one another for sensing an optical angle in one dimension.

FIG. 3 shows an optical angle sensor electronic device 300 having an array of one-dimensional optical angle sensors 100 aligned with one another for sensing an optical angle in one dimension. The array in this example includes rows and columns of instances of the photodiode formed on the semiconductor substrate 101 in a single chip solution with an internal or external sensing circuit 129 as described above. In one implementation, the rows and columns of the optical angle sensors are oriented as shown and described above in connection with FIGS. 1-1D for sensing an angle of incident light along the first direction X. In another implementation, the individual optical angle sensors 100 are each a separate chip.

Figure 4:
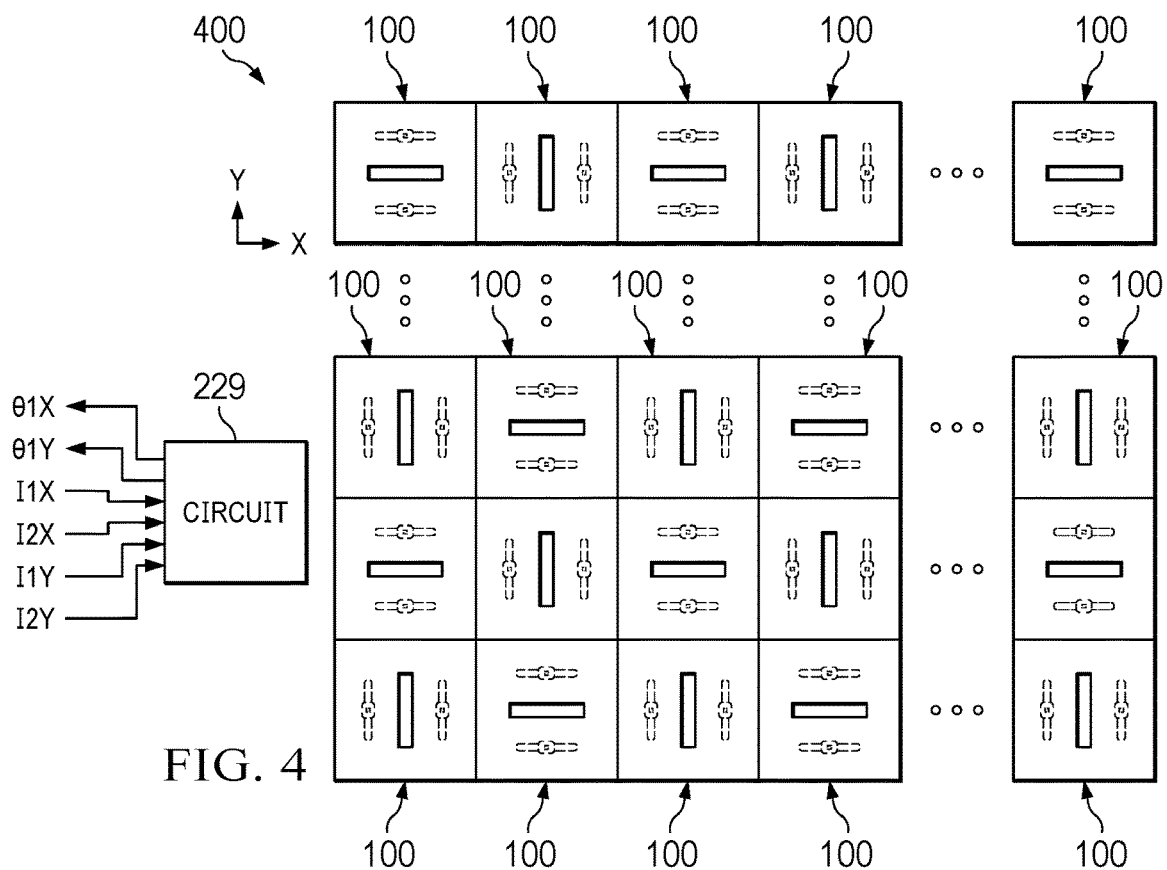
FIG. 4 is a simplified top view of another optical angle sensor electronic device having an array of one-dimensional optical angle sensors with alternating alignment for sensing an optical angle in two dimensions.

FIG. 4 shows another optical angle sensor electronic device 400 having an array of one-dimensional optical angle sensors 100 (single chip or multiple chips) with alternating alignment for sensing an optical angle in two dimensions. In this example, the rows and columns include some of the optical angle sensors 100 are oriented as shown and described above in connection with FIGS. 1-1D for sensing an angle of incident light along the first direction X, and others are rotated 90 degrees to sense the optical angle in the second direction Y. In the illustrated implementation, adjacent instances of the photodiode in the array are rotated 90 degrees from one another in a plane of the first and second directions X and Y. This example includes an integral or separate sensing circuit 229 as described above in connection with FIGS. 2-2B.

Figure 5:
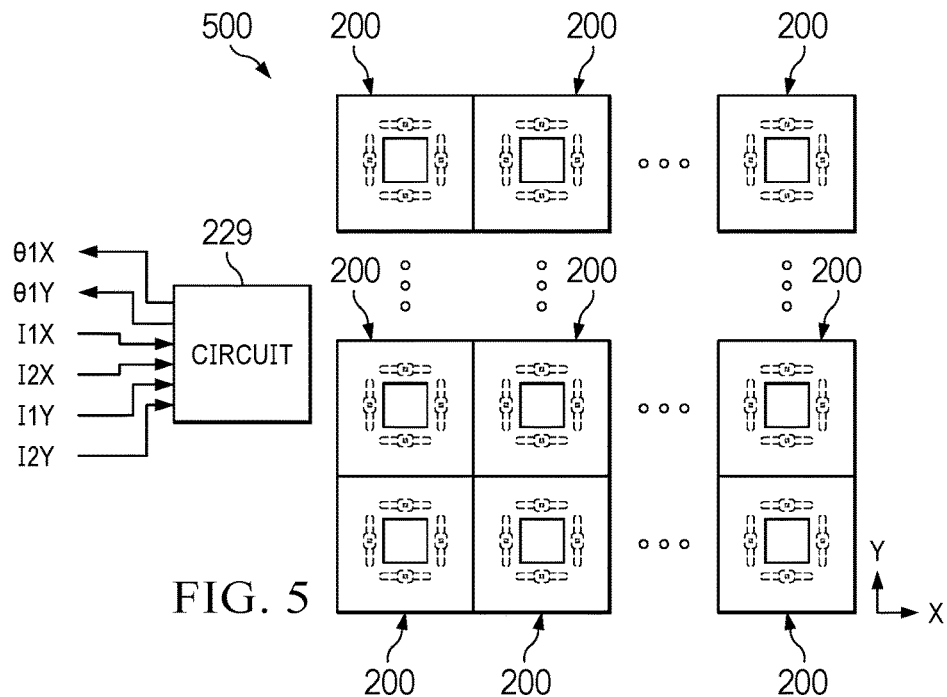
FIG. 5 is a simplified top view of yet another optical angle sensor electronic device having an array of two-dimensional optical angle sensors for sensing an optical angle in two dimensions.

FIG. 5 shows another optical angle sensor electronic device 500 having an array of the two-dimensional optical angle sensors 200 for sensing an optical angle in two dimensions. This implementation has an integral or separate sensing circuit 229 to provide the output signals as described above.

Figure 6:
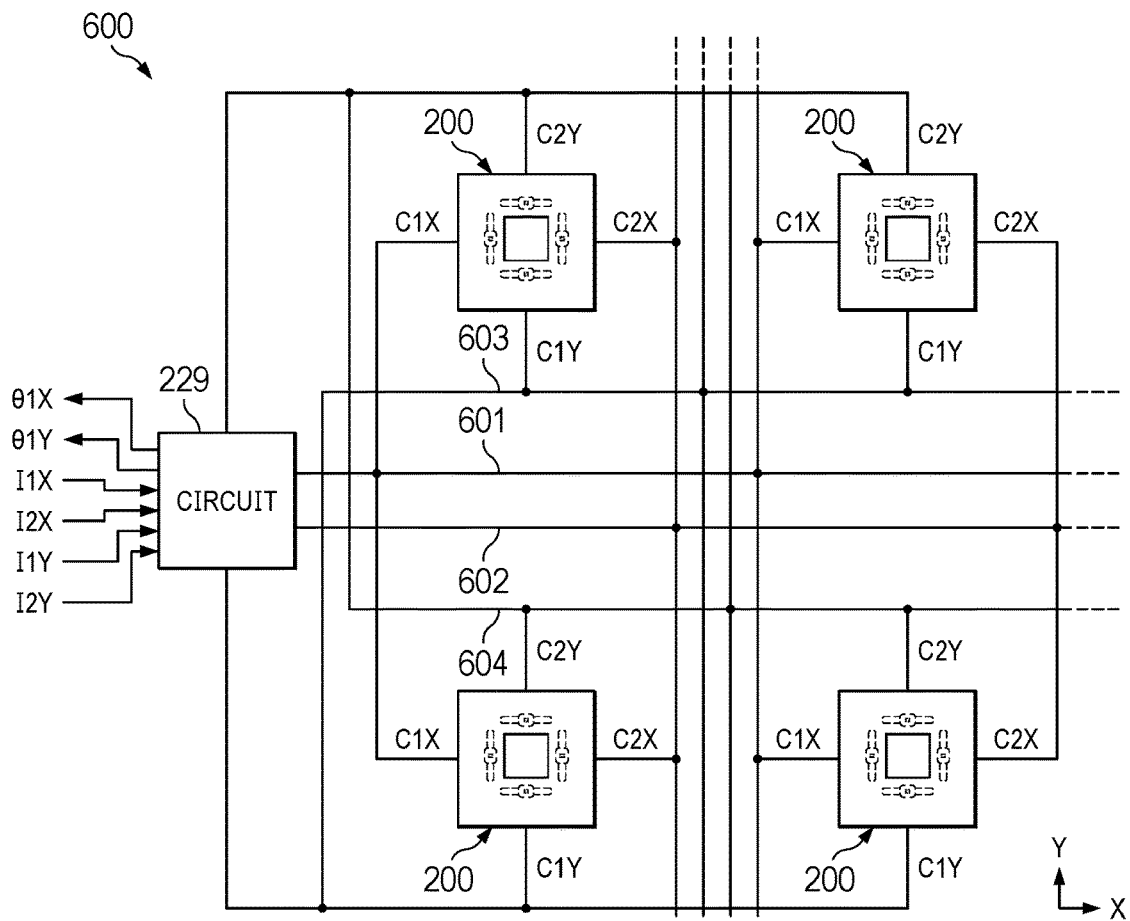
FIG. 6 is a partial schematic top view of a portion of an optical angle sensor electronic device with an array of two-dimensional optical angle sensors with parallel cathode connections.
Figure 6A:
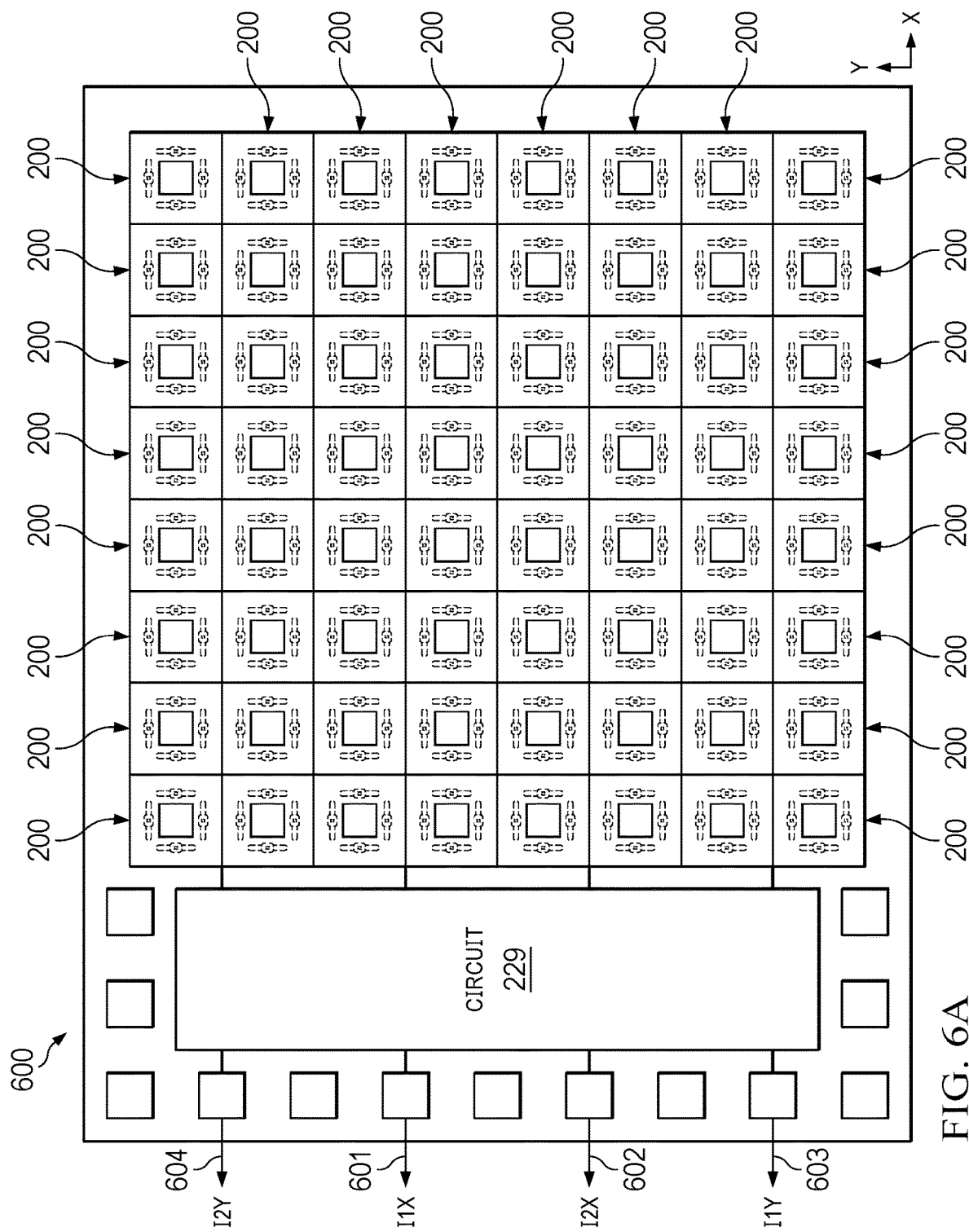
FIG. 6A is a top view of the optical angle sensor of FIG. 6.

FIGS. 6 and 6A show another example integrated circuit 600, a system with an array of the optical angle sensors 200 as described above in connection with FIGS. 2-2B and a sensing circuit 229. In this example, the system includes parallel wiring in which the optical angle sensors 200 in each row of the array are connected electrically in parallel, with each similar cathode connected together to increase the signal levels and reduce the SNR. FIG. 6 shows a portion of the integrated circuit 600 of instances of the two-dimensional optical angle sensor 200 with parallel cathode connections 601 for the first X-direction cathodes $C_{1X}$ (e.g., cathode 211 in FIG. 2B above), connections 602 for the second X-direction cathodes $C_{2X}$ (e.g., cathode 212 above), connections 603 for the first Y-direction cathodes $C_{1Y}$ (e.g., cathode 251 above), and connections 604 for the second Y-direction cathodes $C_{2Y}$ (e.g., cathode 252 above). In this system, the first cathodes 211 of the respective instances of the photodiode in the array are electrically coupled together, the second cathodes 212 of the respective instances of the photodiode in the array are electrically coupled together, the third cathodes 251 of the respective instances of the photodiode in the array are electrically coupled together, and the fourth cathodes 252 of the respective instances of the photodiode in the array are electrically coupled together, and the cathode connections are routed to the sensing circuit 229. FIG. 6A shows a top view of an 8×8 implementation of the integrated circuit 600 of FIG. 6 in a single chip solution for angle and/or position sensing and tracking.

In another example, an array system can include different types of sensors, such as a combination of rotated or aligned one-dimensional angle sensors 100 along or in combination with one or more two-dimensional sensors 200.

Figure 7:
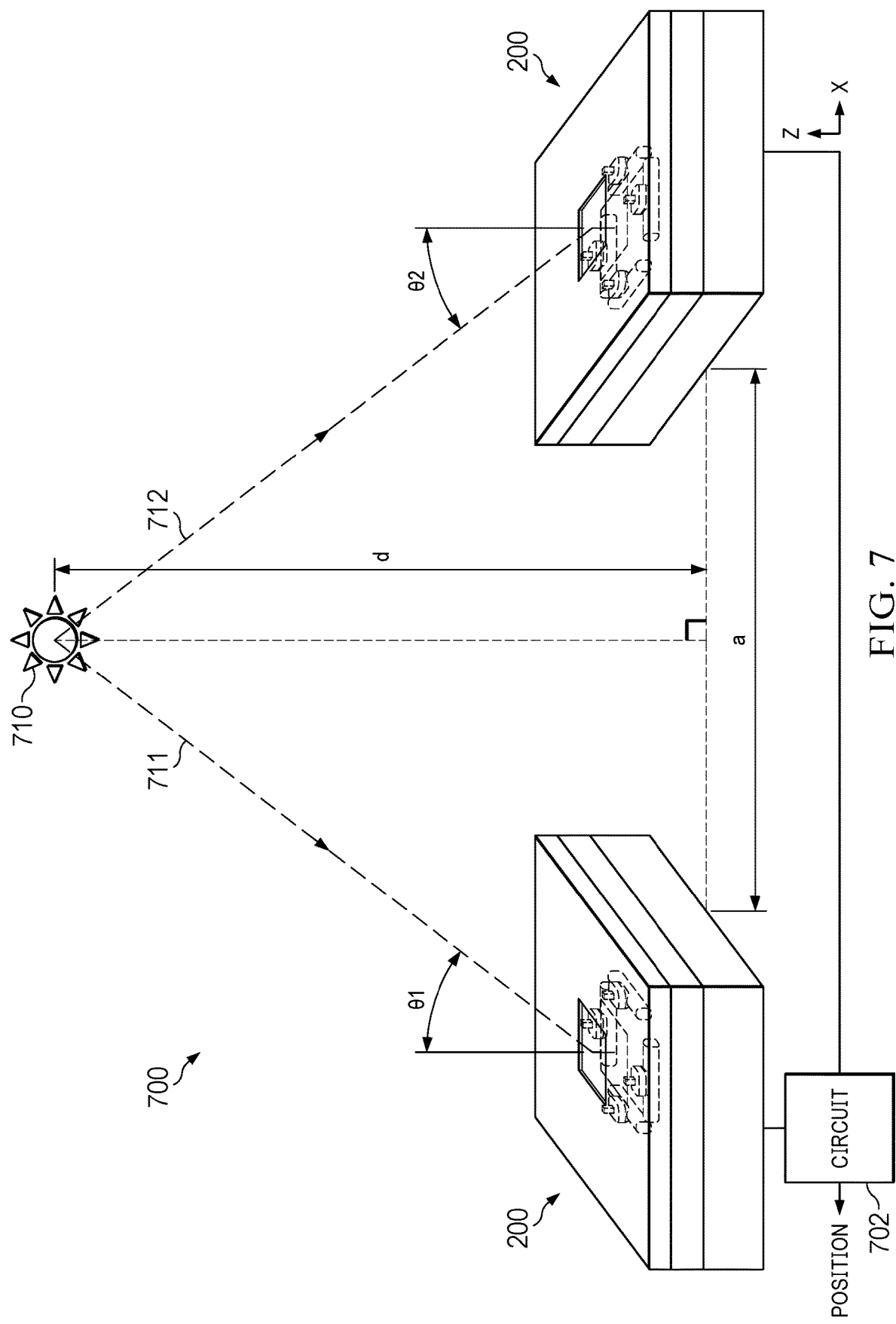
FIG. 7 is a simplified perspective view of an optical angle sensing system having one-dimensional optical angle sensors spaced apart from one another.
Figure 8:
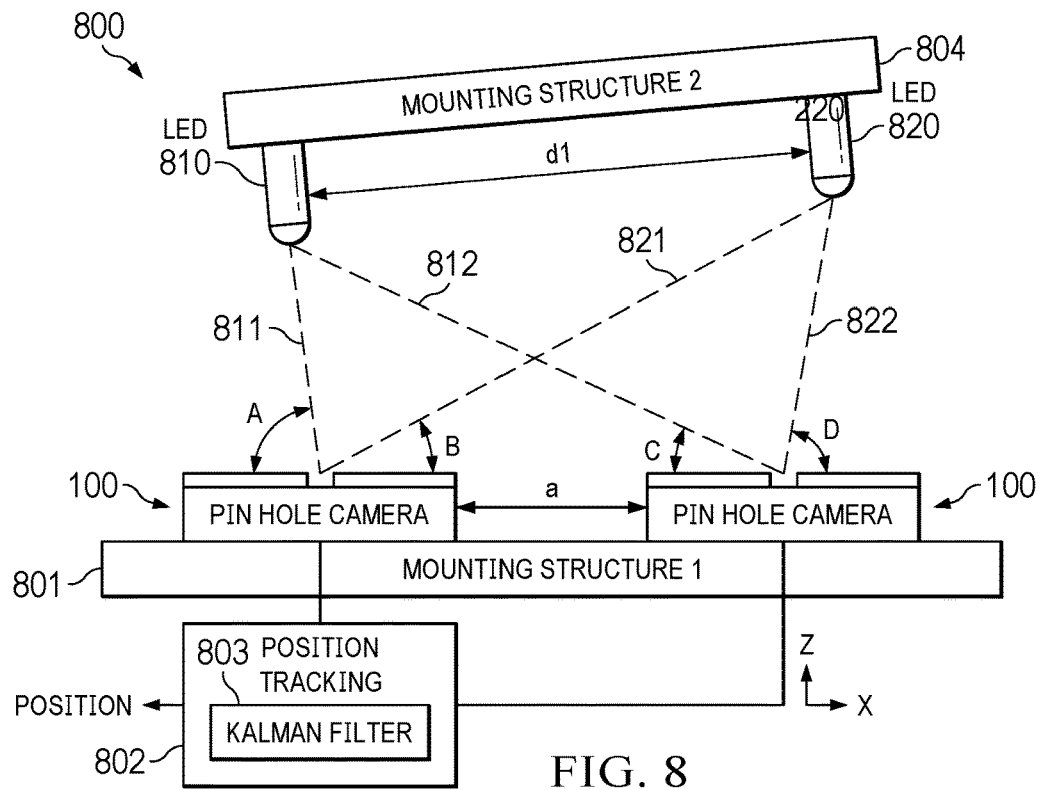
FIG. 8 is a simplified system diagram of a position tracking system with spaced apart one-dimensional optical angle sensors and a position tracking circuit with a Kalman filter for estimating the position of a movable structure.
Figure 9:
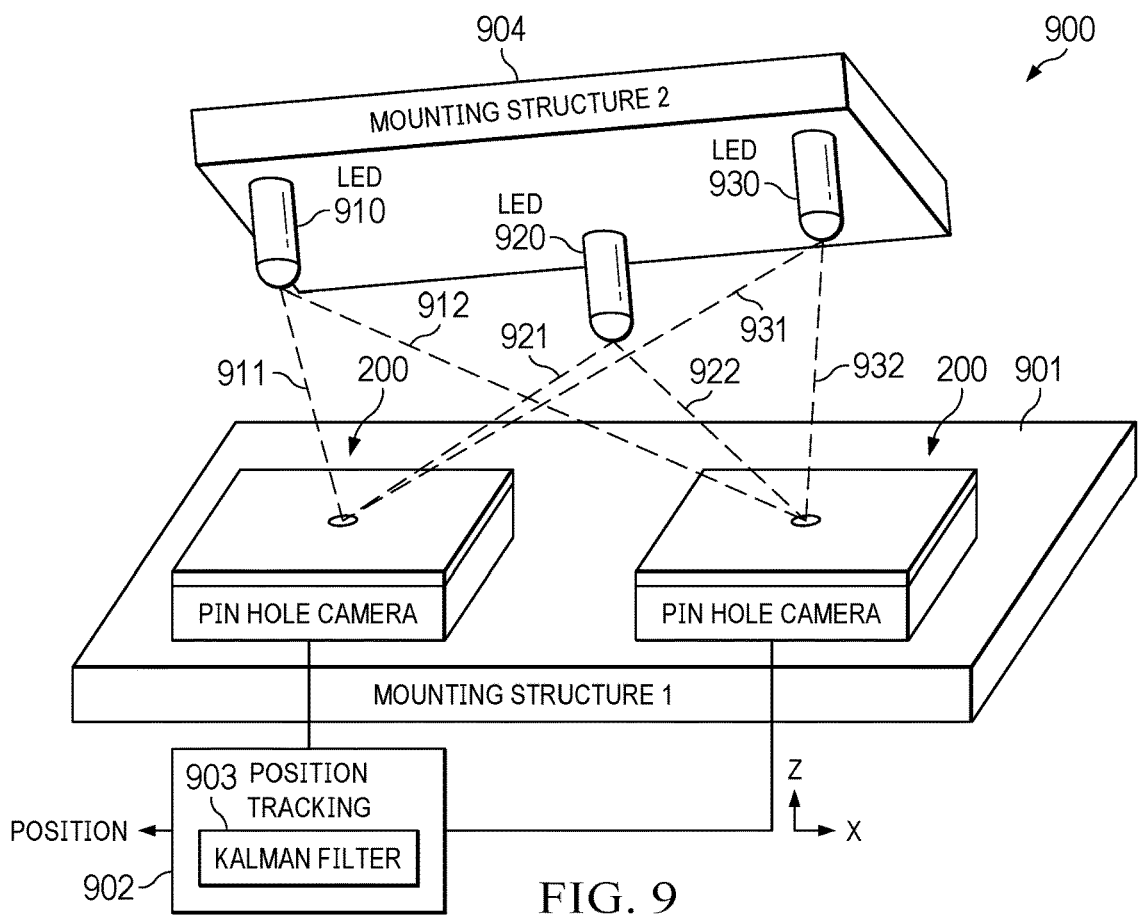
FIG. 9 is a simplified system diagram of another position tracking system with spaced apart two-dimensional optical angle sensors and a position tracking circuit with a Kalman filter for estimating the position of a movable structure.

Referring also to FIGS. 7-9, the array examples (e.g., FIGS. 4-6B) allow multiple sensors or sensor arrays to be placed on the same integrated circuit, die or chip, to facilitate triangulation to find the depth of an object as well as its 1D, 2D or 3D lateral position.

FIG. 7 shows an optical sensing system 700 having two-dimensional optical angle sensors 200 spaced apart from one another. In this description the operation of the sensing system is described with respect to two-dimensional displacement of a light source 710 with respect to the sensing system 700, but those skilled in the art will recognize that the described principles are immediately applicable to three-dimensional displacement of the light source 710. The light source 710, e.g. an object producing or reflecting light, provides incident light 711 received by a first sensor 100 (left-hand side) at a first incident angle $\theta_1$ and incident light 712 received by a second angle sensor 100 (right hand side) at a second incident angle $\theta_2$. A sensing circuit 702 can receive a cumulative signal from each of the optical angle sensors 200. Knowing a spacing a between the optical angle sensors 200, the sensing circuit 702 can determine the values of $\theta_1$ and of $\theta_2$ from the received signals. Using trigonometric formulae, a distance d and angles $\theta_1$ and $\theta_2$ can be determined, allowing the determination of the special location of the light source 710 with respect to the sensing system 700. The optical angle sensors 200 may be located on a same semiconductor substrate, or may be located on separate substrates, allowing the distance a to be large thereby increasing $\theta_1$ and $\theta_2$ for a given value of d. In some examples, arrayed optical angle sensors, such as described with respect to the electronic devices 300, 400, 500 and 600, may be used in lieu of single optical angle sensor.

FIG. 8 shows a position tracking system 800 with spaced apart one-dimensional optical angle sensors in a position tracking circuit with a Kalman filter for estimating the position of a movable structure. The system 800 includes a base mounting structure 801 with two or more one dimensional optical angle sensors 100 as described above in connection with FIGS. 1-1D. The sensors 100 are coupled to a position tracking system or circuit 802 with a Kalman filter 803 to provide an output signal or value representing the position of a second (e.g., movable) mounting structure 804. The second mounting structure 804 has a first LED 810 that provides light 811 at an angle A to a first one of the sensors 100 and provides light 812 at an angle C to the second angle sensor 100. A second LED 820 of the second mounting structure 804 provides light 821 at an angle B to a first sensor 100 and provides light 822 at an angle D to the second angle sensor 100. The LEDs 810 and 820 are spaced apart by a known distance d1 from one another, and the sensors 100 are spaced apart by a known distance a. The position tracking system or circuit 802 performs triangulation on the same chip to determine the depth and/or position of the second mounting structure 804, and the LEDs 810 and 820 are operated such that only one is turned on at a time. The sensors 100 are configured to recognize which LED 810 or 820 is on. As the distance a is known, the position tracking system or circuit 802 measures the angles A and C when the first LED 810 is on and measures the angles C and D when the second LED is on and determines the position of the second mounting structure 804 based on the measured angles A, B, C, and D and the distance a. In one example, the position tracking system or circuit 802 tracks the position of the second mounting structure 804 over time and uses the Kalman filter 803 to improve the current position estimation based on prior position measurements. The position sensing and tracking in the system does not require time of flight (ToF) measurements.

FIG. 9 shows another position tracking system 900 with spaced apart two-dimensional optical angle sensors 200 as described above in connection with FIGS. 2-2B and a position tracking system or circuit 902 with a Kalman filter 903 for estimating the position of a movable structure. The system 900 includes a base mounting structure 901 with two instances of the two-dimensional optical angle sensors 200 as described above in connection with FIGS. 2-2B. The sensors 200 are coupled to the position tracking system or circuit 902 to provide an output signal or value representing the position of a second (e.g., movable) mounting structure 904. The second mounting structure 904 has a first LED 910 that provides light 911 and 912, a second LED 920 that provides light 921 and 922, and a third LED 930 that provides light 931 and 932. The LEDs 910, 920, and 930 are spaced apart by known distances from one another, and the sensors 200 are spaced apart by a known distance. The position tracking system or circuit 902 performs triangulation on the same chip to determine the depth and/or position of the second mounting structure 904, and the LEDs 910, 920, and 930 are operated such that only one is turned on at a time. The sensors 200 are configured to recognize which LED 910 or 920 or 930 is on. The position tracking system or circuit 902 measures the angles at each sensor 200 when the LEDs 910, 920, and 930 are sequentially turned on and determines the position of the second mounting structure 904 based on the measured angles and known relative positions of the LEDs 910, 920, and 930. In one example, the position tracking system or circuit 902 tracks the position of the second mounting structure 904 over time and uses the Kalman filter 903 to improve the current position estimation based on prior position measurements. The position sensing and tracking in the system 900 does not require time of flight (ToF) measurements.

Figure 10:
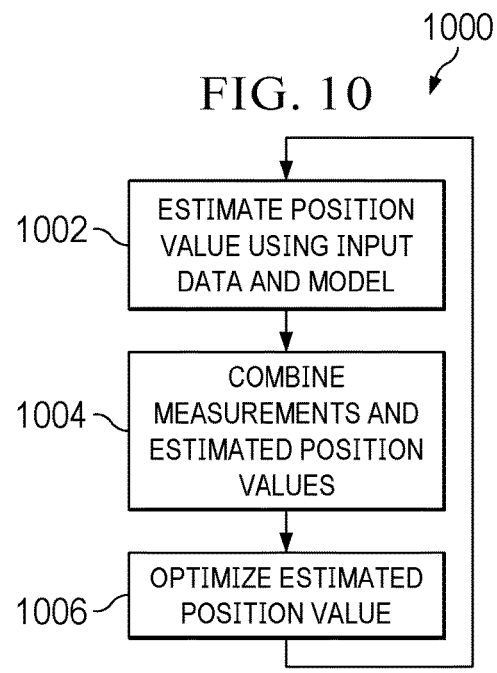
FIG. 10 is a flow diagram of a position estimation or position tracking method.
Figure 11:
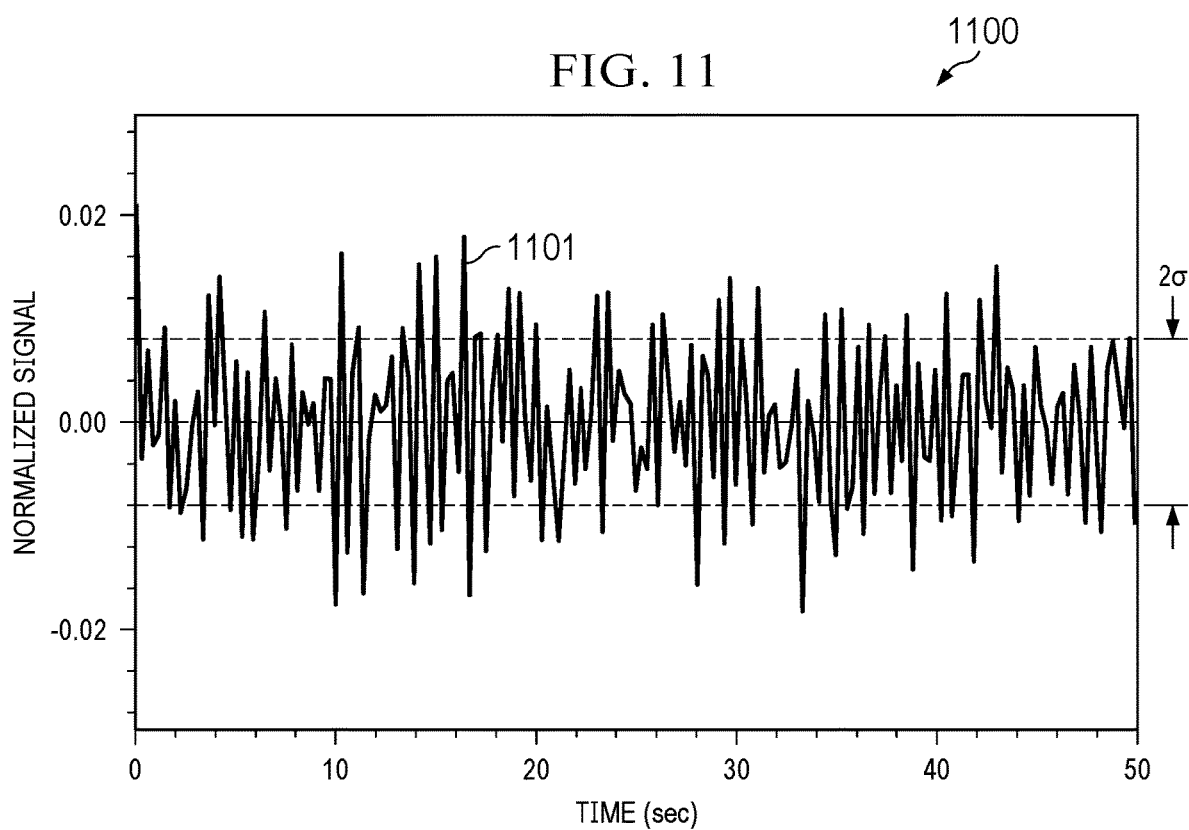
FIG. 11 is a graph of signal samples as a function of time.

Referring now to FIGS. 10 and 11, FIG. 10 shows a position estimation or position tracking method 1000 that can be implemented by the position tracking systems or circuits 802 and/or 902, and FIG. 11 shows a graph 1100 with a curve 1101 of example signal samples as a function of time. At 1002 in FIG. 10, a position value is estimated based on the optical angle signals or values from the sensors 100 or 200. At 1004, the position tracking system or circuit 802 or 902 combines measurements and estimated position values, and the position tracking system or circuit 802 or 902 optimizes or improves the estimated position value at 1006 using the Kalman filter 803 or 903. When used in a practical application, an algorithm can be designed to filter the signal fluctuations to improve the position estimate. The use of arrays of sensors 100 or 200 having small apertures 108 or 208 localizes the image and enhances sensor sensitivity, while lower photo current increases noise. The use of Kalman filtering and arrays of multiple sensors facilitates improved sensitivity together with improved SNR.

Referring also to FIGS. 12-17, FIG. 12 shows a method 1200 of fabricating an optical angle sensor electronic device and FIGS. 13-17 show the optical angle sensor 100 of FIGS. 1-1D undergoing fabrication according to the method 1200.

Figure 13:
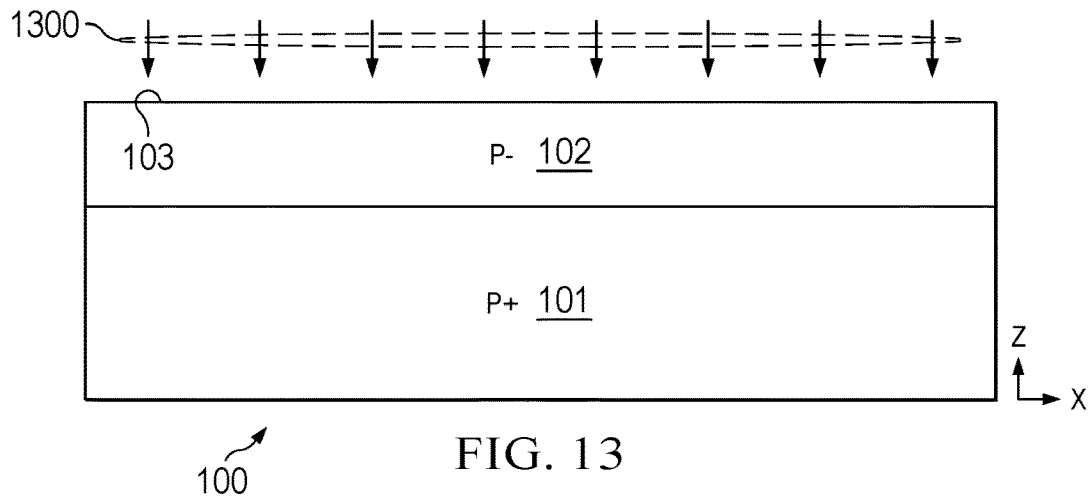
FIGS. 13-17 are partial sectional end views of the optical angle sensor electronic device of FIGS. 1-1D undergoing fabrication according to the method of FIG. 12.
Figure 14:
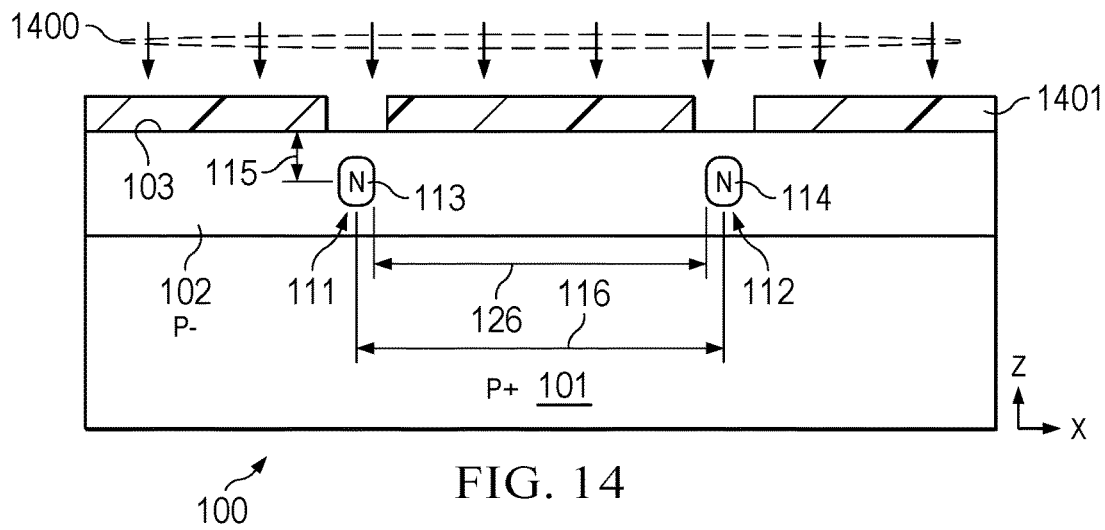

The method 1200 includes forming the semiconductor surface layer 102 at 1200 with majority carrier dopants of the first conductivity type (e.g., p) on the semiconductor substrate 101 having a higher average dopant concentration of majority carrier dopants of the first conductivity type (e.g., p). FIG. 13 shows one example, in which an epitaxial growth or deposition process 1300 is performed to form the p-doped semiconductor surface layer 102 on the semiconductor substrate 101. The method 1200 also includes forming the buried cathode portions 113, 114 with majority carrier dopants of the second conductivity type (e.g., n) in the semiconductor surface layer 102. FIG. 14 shows one example, in which a first implantation process 1400 is performed using a mask 1401 that implants dopants of the second conductivity type (e.g., antimony or arsenic) to form the first and second buried cathode portions 113 and 114 at 1204 (and any other desired buried cathode portions such as portions 253 and 254 in FIGS. 2-2B above) in the semiconductor surface layer 102. The mask 1401 includes openings such that the implanted cathode portions 113 and 114 are spaced apart from one another along the first direction X, extend longitudinally by the buried portion length 119 along the second direction Y. The implantation energy is such that the implanted cathode portions 113 and 114 are spaced apart from the top side 103 of the semiconductor surface layer 102 along the third direction Z.

Figure 15:
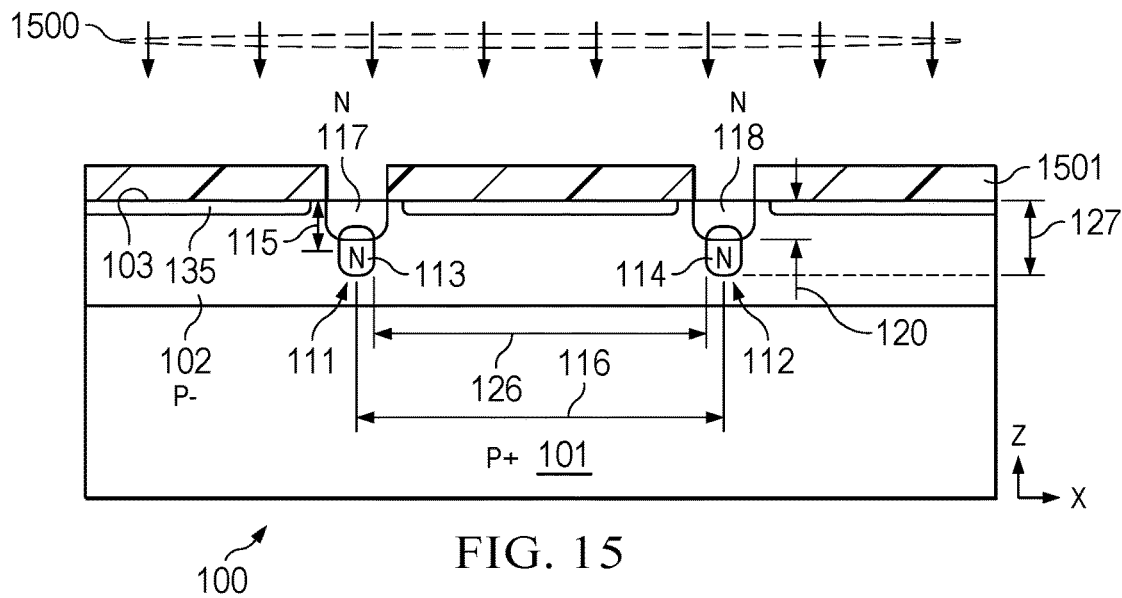

The method 1200 continues at 1206 with forming the cathode contact portions 117 and 118. FIG. 15 shows one example, in which a second implantation process 1500 is performed with a mask 1501 that implants dopants of the second conductivity type (e.g., phosphorus) to form the first and second cathode contact portions 117 and 118 having a higher average dopant concentration of majority carrier dopants of the second conductivity type (e.g., n). The mask 1501 has openings and the implantation process energy is such that the cathode contact portions 117 and 118 extend along the third direction Z in the semiconductor surface layer 102 from a respective one of the first and second buried cathode portions 113 and 114 to the top side 103 of the semiconductor surface layer 102 and extend by the contact portion length 125 along the second direction Y that is less than the buried portion length 119. In an example, phosphorous is implanted with sufficient dose and energy that after diffusion the cathode contact portions 117 and 118 merge with the first and second buried cathode portions 113 and 114 and are degenerately doped with a dopant concentration of at least 1E19 cm$^{-3}$. The method 1200 can also include forming transistors and/or other circuit components (not shown) on or in the semiconductor surface layer 102 to form any included sensing circuit 129 (e.g., FIGS. 1C and 1D above).

Figure 12:
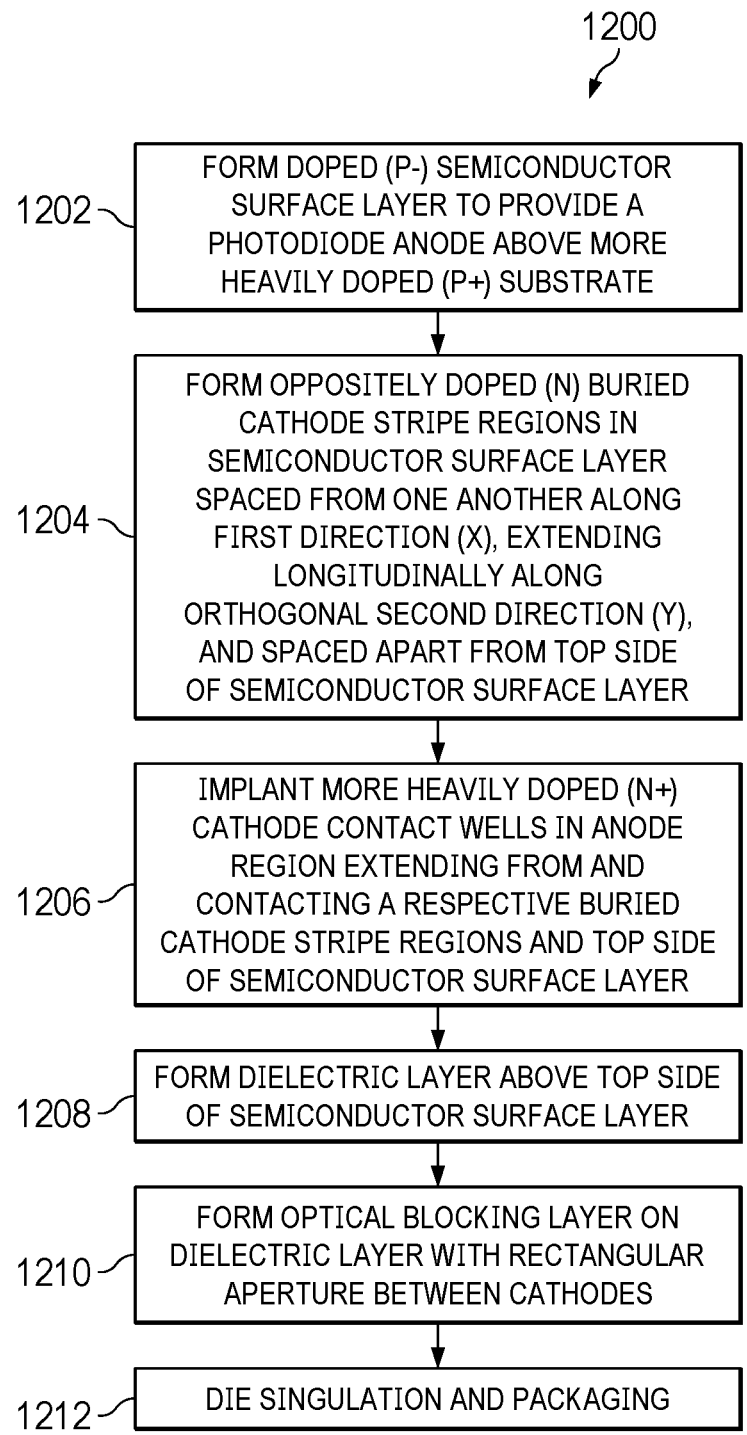
FIG. 12 is a flow diagram of a method of fabricating an optical angle sensor electronic device.
Figure 16:
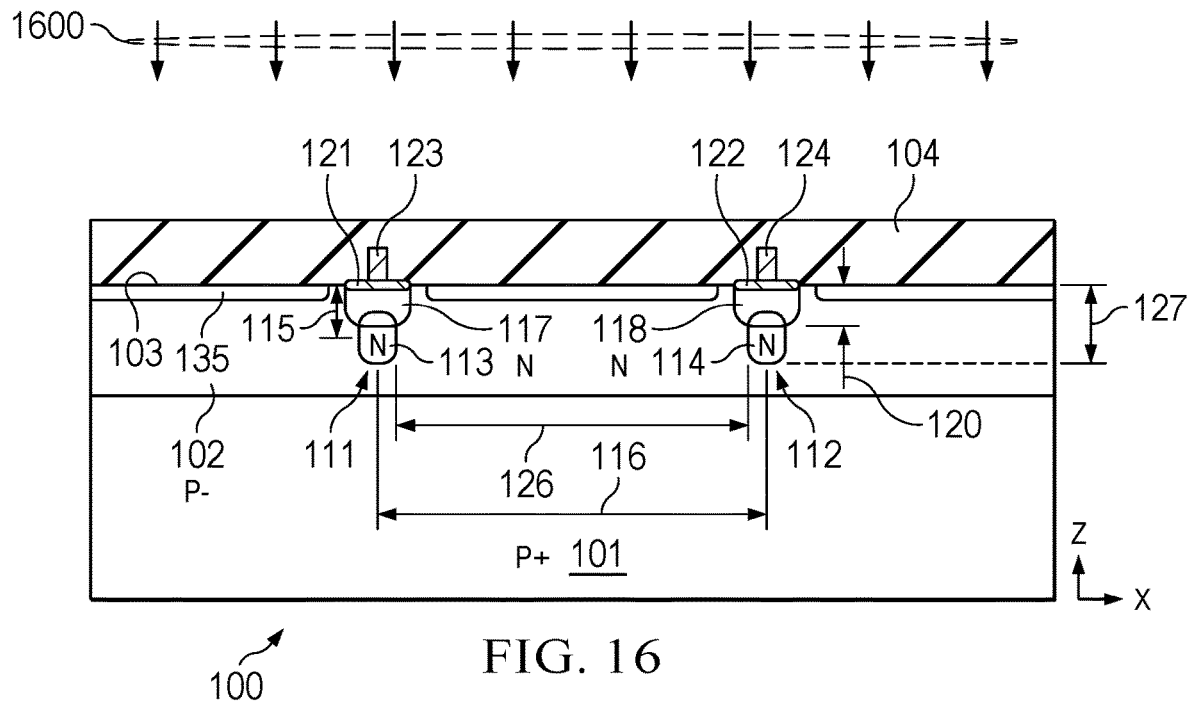
Figure 17:
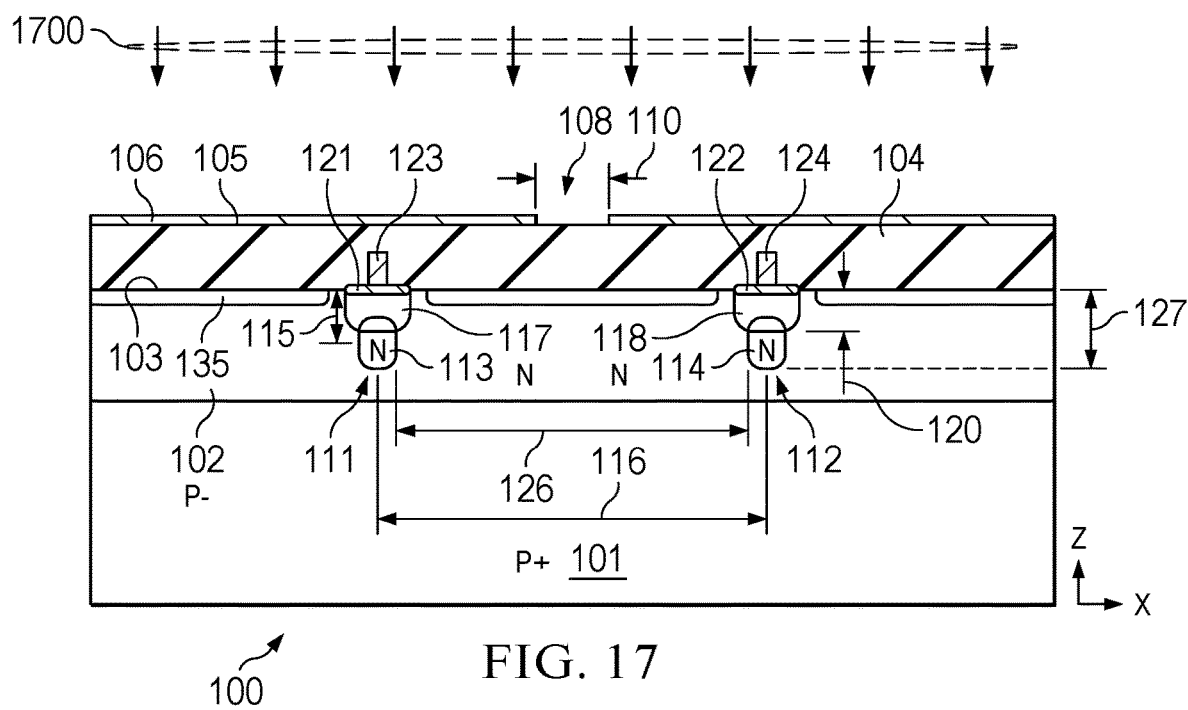

At 1208 in FIG. 12, the method 1200 includes forming the dielectric layer 104 over the top side 103 of the semiconductor surface layer 102. FIG. 16 shows one example, in which a deposition process 1600 is performed that deposits SiO$_2$ or other suitable dielectric material to form the dielectric layer 104 over the top side 103 of the semiconductor surface layer 102. The method 1200 can also include forming any suitable single or multilayer metallization or trace routing structures (not shown) to provide electrodes for cathode and anode connections and routing to an included or external sensing circuit. At 1210, the method includes forming the metal layer 106 over the dielectric layer 104 opposite the semiconductor surface layer 102 with a rectangular (e.g., elongated or square) aperture 108. FIG. 17 shows one example, in which a deposition process 1700 is performed that forms the metal layer 106 with the aperture 108. The method 1200 includes further processing at 1212 including metal contact formation and routing as well as die singulation or separation and packaging (not shown).

Figure 20:
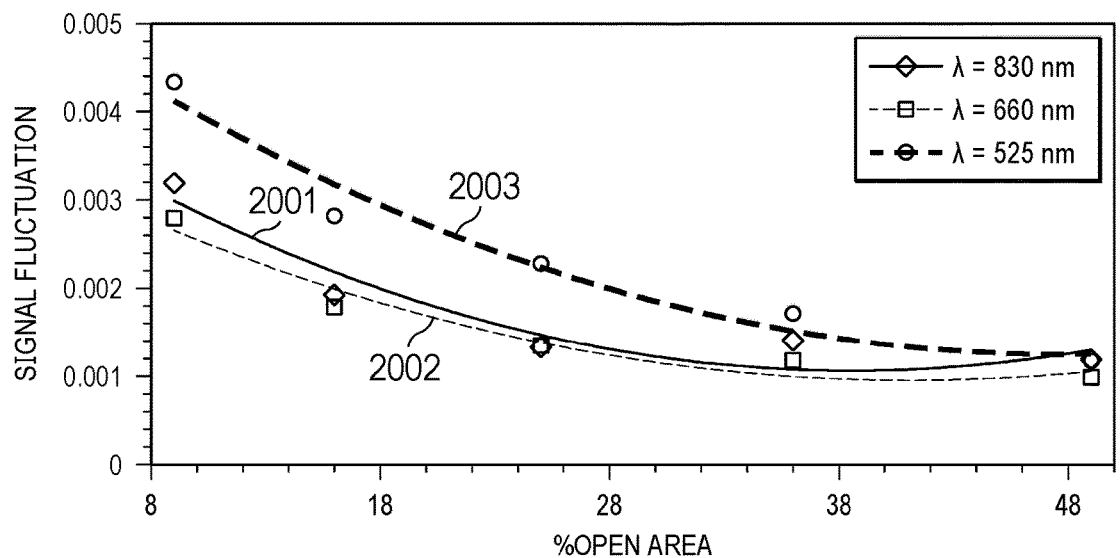

FIGS. 18-20 show example performance data of the one-dimensional optical angle sensor 100 of FIGS. 1-1D. FIG. 18 shows a graph 1800 with curves 1801 and 1802 of measured optical angle provided by the sensor 100 as a function of incident light angle. The curve 1801 shows experimental data demonstrating substantially linear operation over a range 1804 of more than ±70 degrees and the curve 1802 shows theoretical performance. FIG. 19 shows a graph 1900 with curves 1901 and 1902 of photodiode current density in the anode region of the semiconductor surface layer 102 as a function of incident light angle for a fixed incident light source at zero degrees. The curve 1901 shows experimental data and the curve 1902 shows theoretical performance. FIG. 20 shows a graph 2000 with signal fluctuation curves 2001, 2002, and 2003 as a function of percent open area at different wavelengths k. The curve 2001 shows the signal fluctuation at λ=830 nm, the curve 2002 shows the signal fluctuation at λ=660 nm, and the curve 2003 shows the signal fluctuation at X, =525 nm, demonstrating that the fluctuations of the signal (e.g., noise) can be reduced by increasing the aperture open area.

Figure 21:
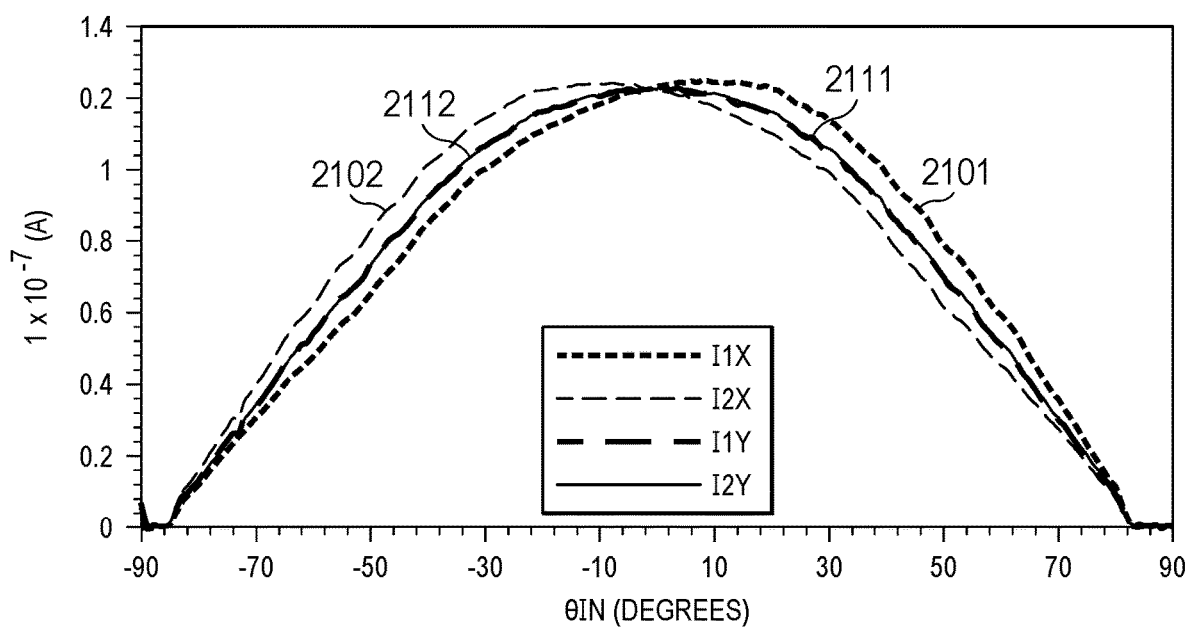

FIGS. 21-23 show performance data of the two-dimensional optical angle sensor 200 of FIGS. 2-2B. FIG. 21 shows a graph 2100 of photo diode current for X-direction movement of a light source with no Y-direction movement, including a curve 2101 showing the current $I_{1X}$ of the first (e.g., left) X-direction cathode (e.g., the first cathode 211 in FIGS. 2-2B above) and a curve 2102 showing the current $I_{2X}$ of the second (e.g., right) X-direction cathode (e.g., second cathode 212 in FIGS. 2-2B), which show imbalance in response to the X-direction light source movement. The graph 2100 also shows a curve 2111 showing the current $I_{1Y}$ of the third (e.g., bottom) Y-direction cathode (e.g., third cathode 251 in FIGS. 2-2B) and a curve 2112 showing the current $I_{2Y}$ of the fourth (e.g., top) Y-direction cathode (e.g., fourth cathode 252 in FIGS. 2-2B), which show no imbalance in response to the X-direction light source movement.

FIG. 22 shows a graph 2200 with curves 2201 and 2202 of measured optical angle provided by the sensor 100 as a function of incident light angle. The curve 2201 shows experimental data demonstrating substantially linear operation over a range 2204 of more than ±70 degrees and the curve 2202 shows theoretical performance. FIG. 23 shows a graph 2300 with curves 2301 and 2302 of photodiode current density in the anode region of the semiconductor surface layer 102 as a function of incident light angle for a fixed incident light source at zero degrees. The curve 2301 shows experimental data and the curve 2302 shows theoretical performance.

Figure 24:
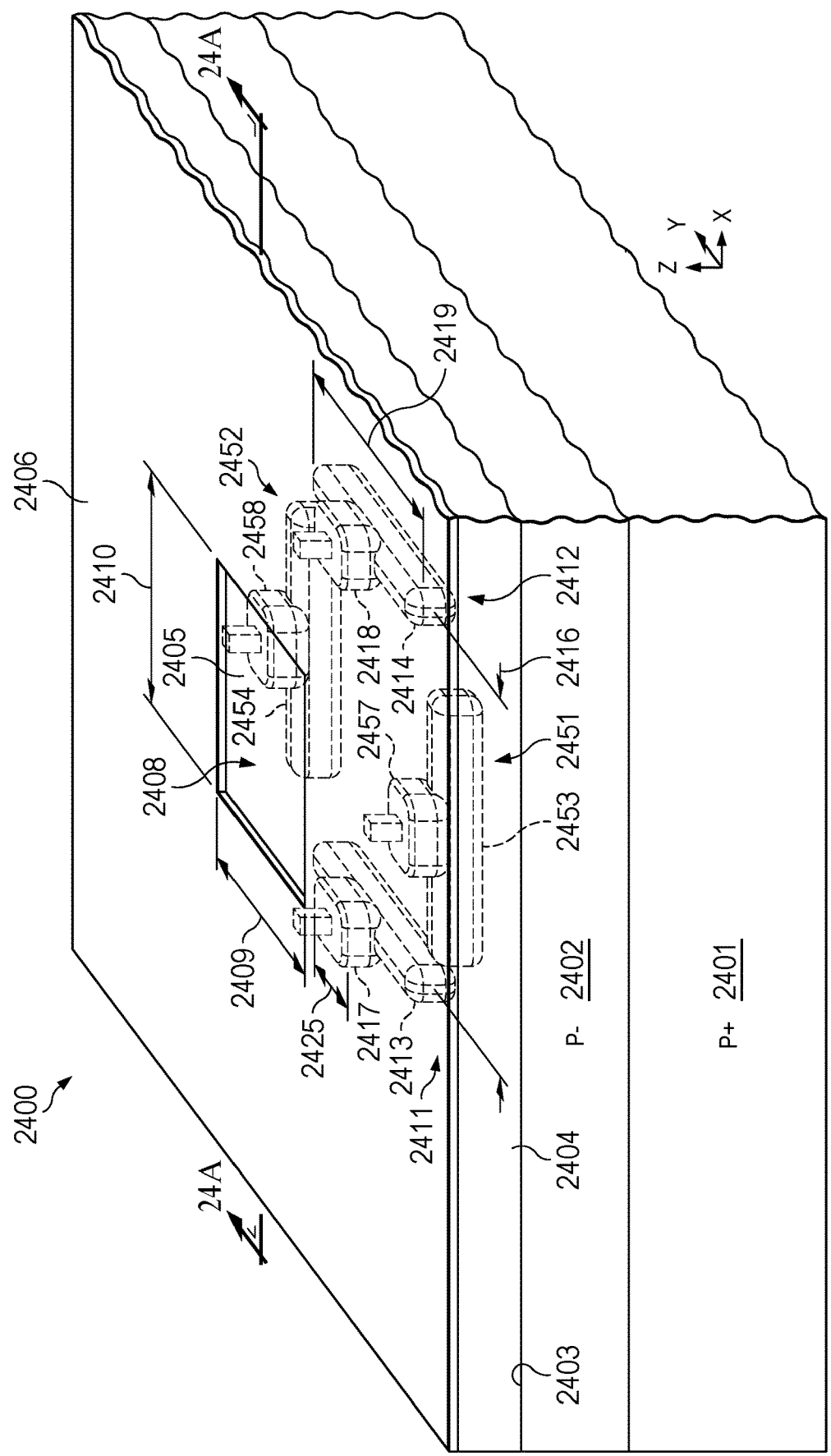
FIG. 24 is a perspective view of another optical angle sensor electronic device having a square sensor aperture and four cathodes for sensing optical angle in two dimensions.
Figure 24A:
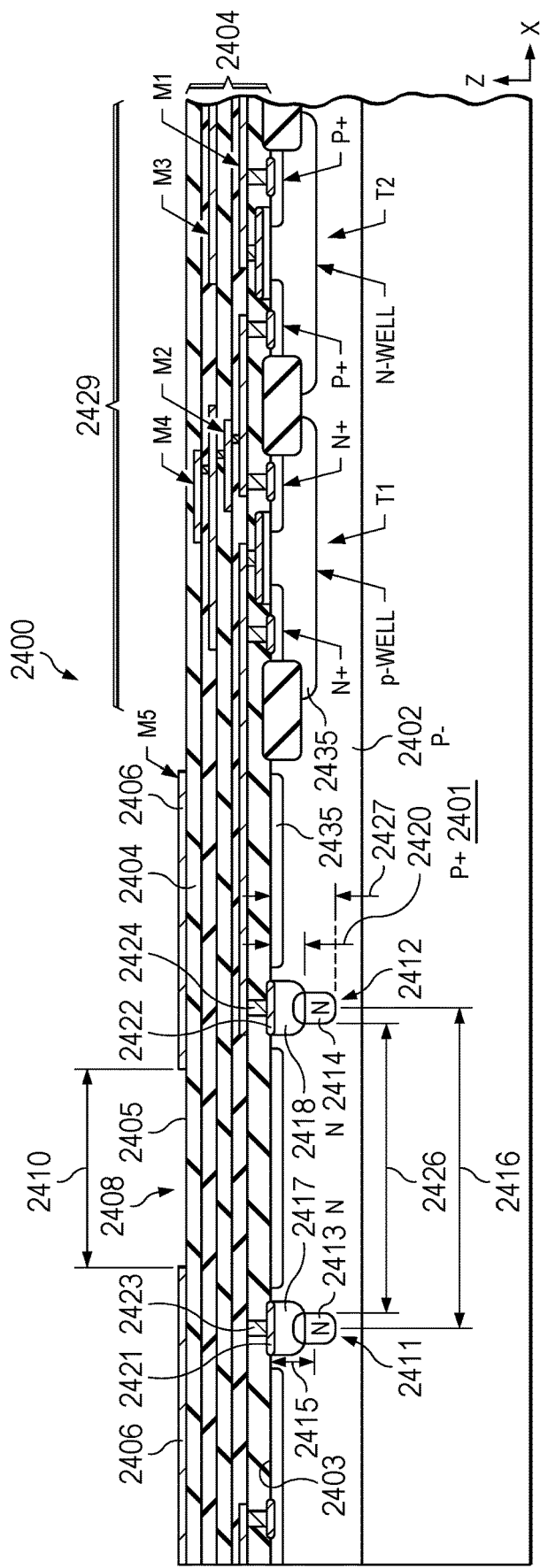
FIG. 24A is a sectional end view of the optical angle sensor taken along line 24A-24A of FIG. 24.
Figure 24B:
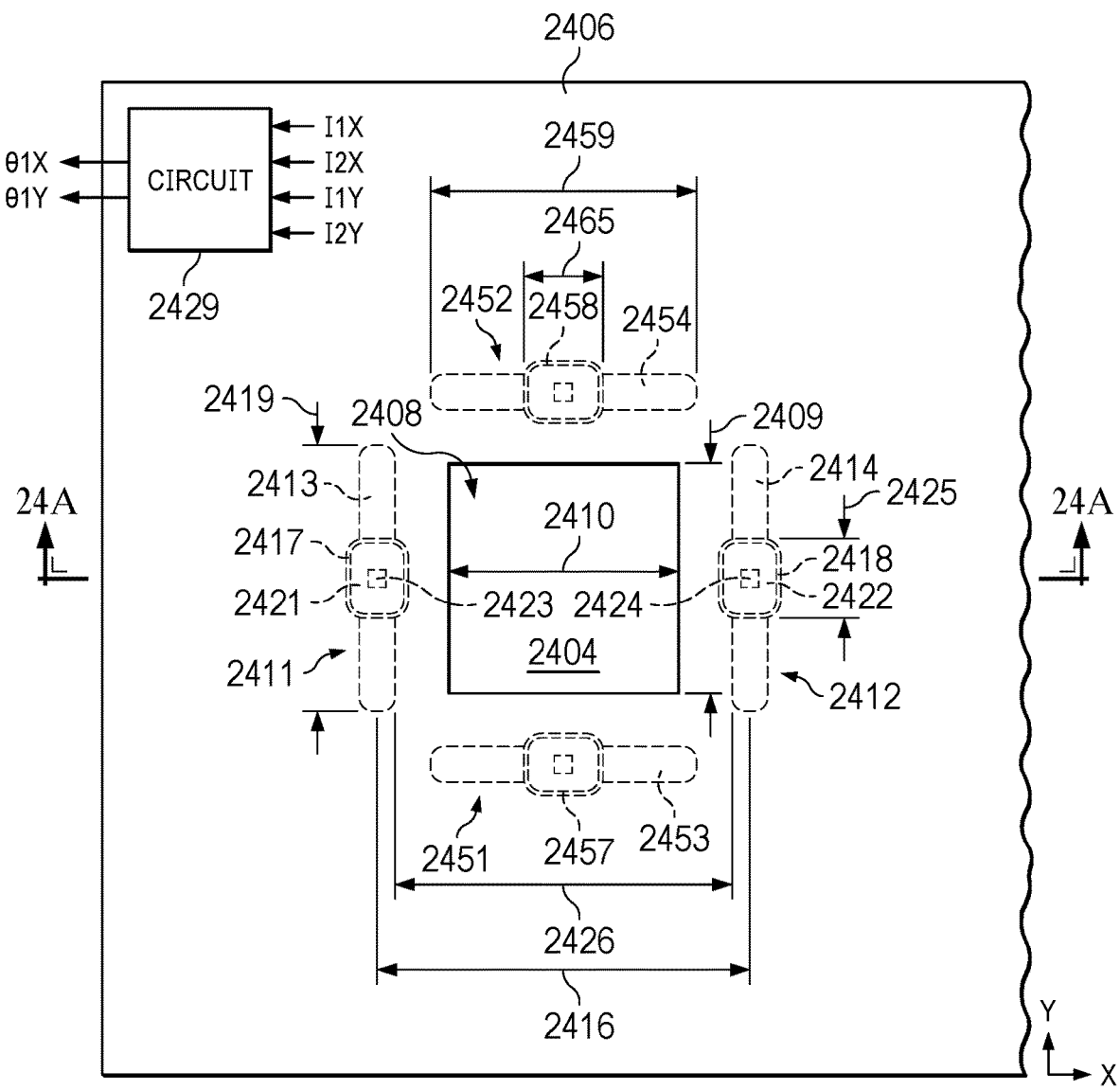
FIG. 24B is a top view of the electronic device of FIG. 24.

FIGS. 24-24B show another optical angle sensor 2400 integrated with other circuit components in an integrated circuit. The optical angle sensor 2400 has a square sensor aperture and four cathodes for sensing optical angle in two dimensions along the first direction X and/or along the second direction Y. FIG. 24A shows the optical angle sensor 2400 taken along line 24A-24A of FIG. 24 and FIG. 24B shows a top view of the optical angle sensor 2400. The optical angle sensor 2400 in FIGS. 24-24B has a semiconductor substrate 2401, for example, heavily doped silicon of a starting silicon or SOI wafer having majority carrier dopants of the first conductivity type (e.g., p) and a first average dopant concentration. The semiconductor material for the semiconductor substrate 2401 may be single-crystal Si, but the material may include other type of materials, such as Ge, SiGe, GaAs, InAs, SiGeC, GaN, or SiC. In the illustrated example, the first conductive type is p-type and an opposite second conductive type is n-type.

The optical angle sensor 2400 also includes a semiconductor surface layer 2402 that has majority carrier dopants of the first conductivity type (e.g., p-type) and a generally planar top side 2403 that extends in a plane of the first and second directions X and Y, respectively. In one example, the semiconductor surface layer 2402 is an epitaxial layer, such as epitaxial silicon. The semiconductor surface layer 2402 has a second average dopant concentration that is less than the first average dopant concentration of the substrate 2401.

The integrated circuit of FIGS. 24-24B includes the optical angle sensor 2400 as well as transistors T1 and T2 and other transistors and circuit components (not shown) to form a sensing circuit 2429 with material layers common to (e.g., shared by) both the optical angle sensor 2400 and the sensing circuit 2429. The sensing circuit 2429 and the transistors T1 and T2 thereof are separated from the optical angle sensor 2400 by shallow trench isolation (STI) structures in the illustrated example. The portion shown in FIG. 24A includes a five-layer metallization structure with metal layers M1, M2, M3, M4, and M5 having patterned metal traces in each level. A dielectric layer 2404 has a top side 2405 and includes several stacked dielectric sublayers that extend over (e.g., above or directly on) the top side 2403 of the semiconductor surface layer 2402. The dielectric layer 2404 may include any number of dielectric sub-layers consistent with a multi-level metal interconnect structure. For example, the dielectric layer 2404 may include layers of silicon oxide. Nearest-neighbor silicon oxide layers may be separated by a silicon nitride layer or other dielectric layer dissimilar to silicon oxide. The dielectric layer 2404 may have a refractive index (RI) that is higher than that of homogeneous silicon oxide (e.g., about 1.5 @ 660 nm) as a result of the presence of other dielectric material layers such as silicon nitride. In some examples the RI of the dielectric layer 2404 may be at least 2.0 @ 660 nm. A metal layer 2406 in the fifth metal layer M5 extends over (e.g., above or directly on) the top side 2405 of the dielectric layer 2404 opposite the semiconductor surface layer 2402. Candidate materials for the metal layers M1-M5 including the metal layer 2406 include, but are not limited to Al, Cu, Ti, TiN, Pt, W, Ta, TaN and combinations or alloys thereof. The metal layer 2406 includes a rectangular aperture 2408 having four substantially straight and substantially equal sides, e.g., a square shape. The example aperture 2408 of FIGS. 24-24B has an aperture length 2409 along the second direction Y and a substantially equal aperture width 2410 along the first direction X. The first metal layer M1 in this example connects the gate of the transistor T1 to a second cathode contact metal structure 2422 and other metallization structure traces (not shown) connect a first cathode contact to the sensing circuit 2429.

In various implementations, the optical angle sensor 2400 or other optical angle sensors (e.g., 100 and 200 above) can be made using a standard process and integrated with other devices on the same substrate. The optical angle sensor 100, 200, 2400 can be integrated with one or more transistors and/or other electronic components in existing process technologies and is broadly applicable to various technology nodes.

The optical angle sensor 2400 includes a first cathode 2411 and a second cathode 2412 of a photodiode for sensing optical angle along the first direction X. As shown in FIGS. 24 and 24B, the optical angle sensor 2400 also includes a third cathode 2451 and a fourth cathode 2452 of the photodiode for sensing optical angle along the second direction Y. The cathodes 2411, 2412, 2451, and 2452 are formed in the semiconductor surface layer 2402 and have majority carrier dopants of the second conductivity type (e.g. n-type). The first and second cathodes 2411 and 2412 are elongated along the second direction Y and are laterally spaced apart from one another along the first direction X. The third and fourth cathodes 2451 and 2452 are elongated along the first direction X and are laterally spaced apart from one another along the second direction Y. In operation, the aperture 2408 collimates incident light onto an anode region of the semiconductor surface layer 2402 that extends laterally along the first direction X between the cathodes 2411 and 2412 and along the second direction Y between the cathodes 2451 and 2452.

As shown in FIG. 24A, the laterally spaced apart and elongated cathodes 2411 and 2412 include elongated and heavily n-doped buried cathode portions 2413 and 2414 implanted at an average depth 2415 below the top side 2403 of the semiconductor surface layer 2402 and the tops of the buried cathode portions 2413 and 2414 are spaced apart from the top side 2403 of the semiconductor surface layer 2402 along the third direction Z. In addition, the centers of the buried cathode portions 2413 and 2414 are laterally spaced apart by a distance 2416 along the first direction X. The cathodes 2411 and 2412 also include shorter, heavily n-doped cathode contact portions 2417 and 2418, respectively. The cathode portions 2413, 2414, 2417 and 2418 have majority carrier dopants of the second conductivity type (e.g., n). The third and fourth cathodes 2451 and 2452 include respective elongated and heavily n-doped third and fourth buried cathode portions 2453 and 2454 implanted at the same average depth 2415 below the top side 2403 of the semiconductor surface layer 2402. The tops of the third and fourth buried cathode portions 2453 and 2454 are spaced apart from the top side 2403 of the semiconductor surface layer 2402 along the third direction Z. In addition, the centers of the third and fourth buried cathode portions 2453 and 2454 are laterally spaced apart by a distance along the second direction Y (e.g., substantially equal to the distance 2416). The cathodes 2451 and 2452 also include shorter, heavily n-doped third and fourth cathode contact portions 2457 and 2458, respectively. The cathode portions 2453, 2454, 2457 and 2458 have majority carrier dopants of the second conductivity type (e.g., n).

Referring to FIG. 24A, the cathodes 2411 and 2412 are located between diode wells 2435, and one diode well region is located between the cathodes 2411 and 2412. The transistor T1 is representative of any number of NMOS transistors in the optical angle sensor 2400, and includes a p-type well (P-WELL) that may be formed concurrently with the diode well regions 2435. Thus, the T1 P-WELL may have a same dopant profile as the diode wells 2435.

As shown in FIG. 24B, the first and second buried cathode portions 2413 and 2414 are elongated and have a buried portion length 2419 along the second direction Y. The third and fourth buried cathode portions 2453 and 2454 are elongated and have a buried portion length 2459 along the first direction X (e.g., substantially equal to the length 2419). The first and second cathode contact portions 2417 and 2418 are smaller, and have contact portion lengths 2425 that are less than the buried portion lengths 2419 along the second direction Y. The third and fourth cathode contact portions 2457 and 2458 have contact portion lengths 2465 that are less than the buried portion lengths 2459 along the first direction X (e.g., substantially equal to the length 2425). The buried portion lengths 2419 and 2459 are greater than the aperture length 2409 and the buried portion lengths 2419 and 2459 are greater than the aperture width 2410, although not a requirement of all possible implementations. The cathode contact portions 2417, 2418, 2457, and 2458 are implanted to an average depth 2420 below the top side 2403 of the semiconductor surface layer 2402 along the third direction Z and extend from the top side 2403 of the semiconductor surface layer 2402 to the respective buried cathode portions 2413, 2414, 2453, and 2454.

The aperture 2408 is located over a portion of the semiconductor surface layer 2402 that forms an anode of the photodiode between the first and second contact portions 2417 and 2418 along the first direction X and between the third and fourth contact portions 2417 and 2418 along the second direction Y. The cathodes 2411, 2412, 2451, and 2452 are under and shadowed by the metal layer 2406 along the third direction Z, where the first contact portion 2417 faces a first portion of the metal layer 2406 along the third direction Z, the second contact portion 2418 faces a second portion of the metal layer 2406 along the third direction Z, the third contact portion 2457 faces a third portion of the metal layer 2406 along the third direction Z, and the fourth contact portion 2458 faces a fourth portion of the metal layer 2406 along the third direction Z.

The optical angle sensor 2400 in one example includes contact metal structures (e.g., tungsten, etc.) and electrodes (not shown) for signal connection of the cathodes 2411, 2412, 2451, and 2452 and of the anode of the semiconductor surface layer 2402 to a sensing circuit 2429 as schematically shown in FIG. 24B, for example, by conductive routing structures or metallization trace layers in the dielectric layer 2404. As shown in FIGS. 24A and 24B, a first cathode contact metal structure 2421 extends on a top side of the first cathode contact portion 2417 and the second cathode contact metal structure 2422 extends on a top side of the second cathode contact portion 2418. A first electrode 2423 extends upward along the third direction Z from the first cathode contact metal structure 2421 for electrically coupling the first cathode 2411 to the sensing circuit 2429 and a second electrode 2424 extends upward along the third direction Z from the second cathode contact metal structure 2422 for electrically coupling the second cathode 2412 to the sensing circuit 2429. In one example, the sensing circuit 2429 includes circuit components (e.g., transistors, diodes, resistors, etc., not shown) formed on or in the semiconductor surface layer 2402 to form a circuit that generates or otherwise provides a signal or value $\theta_{1X}$ representing an incident light angle along the first direction X based on a difference in current of the first and second cathodes 2411 and 2412 (e.g., a percentage of the total photocurrent which is steered to one or the other cathode), as well as a signal or value $\theta_{1Y}$ representing an incident light angle along the second direction Y based on a difference in current of the third and fourth cathodes 2451 and 2452 (e.g., a percentage of the total photocurrent which is steered to one or the other cathode). In another implementation, the sensing circuit 2429 is external to the optical angle sensor device 2400 and the optical angle sensor device 2400 includes conductive terminals (e.g., copper or aluminum bond pads, not shown) to allow electrical connection of the n-doped cathodes 2411, 2412, 2451, and 2451 and the p-doped anode of the semiconductor surface layer 2402 to the circuit 2429, for example, via bond wires, flip-chip solder connections, etc.

As shown in FIG. 24A the cathodes 2411, 2412, 2451, and 2452 extend in the semiconductor surface layer 2402 to a cathode depth 2427 from the top side 2403 of the semiconductor surface layer 2402 along the third direction Z. The buried portions 2413, 2414, 2453, and 2454 extend to the cathode depth 2427 along the third direction Z. In the illustrated example, the second cathode 2412 is spaced apart from the first cathode 2411 along the first direction X by the spacing distance 2426 that is greater than the aperture width 2410 and greater than the aperture length 2409. The third and fourth cathodes 2451 and 2452 are spaced apart from one another along the second direction Y by the same distance, which is greater than the aperture length and width dimensions 2409 and 2410. The cathode depth 2427 is less than the aperture width 2410 and are less than the aperture length 2409. In the illustrated example, the buried portions 2413, 2414, 2453, and 2454 have buried portion average dopant concentrations and the contact portions 2417, 2418, 2457, and 2458 have contact portion average dopant concentrations that are greater than the buried portion average dopant concentrations. In addition, the second average dopant concentration of the semiconductor surface layer 2402 is less than the buried portion average dopant concentrations, and the second average dopant concentration of the semiconductor surface layer 2402 is less than the contact portion average dopant concentrations.

FIG. 24B shows schematic connections of the photodiode anode and cathodes to the sensing circuit 2429. In operation, the sensing circuit 2429 provides one or more signals in response to incident light received through the sensor aperture 2408 (e.g., light 130 in FIG. 1D above). The incident light enters the aperture 2408 at a first or input angle and the $SiO_2$ of the dielectric layer 2404 refracts the light to change the light angle to a second angle. The incoming light enters the anode portion of the semiconductor surface layer 2402 between the cathodes 2411, 2412, 2451, and 2452 and causes a photo-response on the photodiode, in which the p-type semiconductor surface layer 2402 generates electron-hole pairs. The electrons generated in the p-type semiconductor surface layer 2402 may diffuse to the cathodes 2411, 2412, 2451, and 2452 and are collected by the sensing circuit 2429 as photocurrent via the associated cathode electrodes (not shown). For each of the first and second directions X and Y, the incident light angle generates a photocurrent density distribution in the semiconductor surface layer 2402 along the respective first and second directions X and Y between the cathodes (e.g., graph 140 in FIG. 1D above). In one example, the sensing circuit 2429 a signal or value $\theta_{1X}$ representing the incident light angle along the first direction X based on the difference in current of the first and second cathodes 2411 and 2412 (e.g., a percentage of the total photocurrent which is steered to one or the other cathode), as well as a signal $\theta_{1Y}$ representing the incident light angle along the second direction Y based on the difference in current of the third and fourth cathodes 2451 and 2452 (e.g., a percentage of the total photocurrent which is steered to one or the other cathode). In this example, the sensing circuit 2429 generates the optical angle estimate output signal or value $\theta_{1X}$ as $\Sigma=(I_{signal}/I_{total})=(I_L-I_R)/(I_L+I_R)=CONST*\theta_1$, where the constant CONST depends on the layout dimensions and incident wavelength of the light, $I_L$ is the current of the first cathode 2411 and $I_R$ is the current of the second cathode 2412. In this or another example, the sensing circuit 2429 provides output signals or values $I_{1X}$ and $I_{2X}$ representing the currents of the respective first and second cathodes 2411 and 2412 and output signals or values $I_{1Y}$ and $I_{2Y}$ representing the currents of the respective first and second cathodes 2451 and 2452. In this example, the sensing circuit 2429 generates the optical angle estimate output signal or value $\theta_{1Y}$ as $\Sigma=(I_{signal}/I_{total})=(I_R-I_T)/(I_R+I_T)=CONST*\theta_1$, where the constant CONST depends on the layout dimensions and incident wavelength of the light, $I_B$ is the current of the third cathode 2451 and $I_B$ is the current of the fourth cathode 2452. This allows angle sensing, position sensing and tracking and other functions in two dimensions (e.g., X-direction and Y-direction in the illustrated sensor orientation).

The described examples provide improved optical angle sensor performance and image or object position sensing and tracking system performance advantages along with cost and size reduction, which can be built in a single microchip. The described examples do not require external optics and provide improved linear response over a wide angular range, whereas more complex and expensive systems with focusing optics (e.g., a fish-eye lens) may provide a wide field of view but distort the image.

Unless otherwise stated, "about," "approximately," or "substantially" preceding a value means ±10 percent of the stated value. The above examples are merely illustrative of several possible implementations of various aspects of the present disclosure, wherein equivalent alterations and/or modifications will occur to others skilled in the art upon reading and understanding this specification and the annexed drawings. Modifications are possible in the described examples, and other implementations are possible, within the scope of the claims.

What is claimed is:

1. An integrated circuit, comprising:
   a semiconductor substrate with a semiconductor surface layer having a first conductivity type and a top surface;
   a diode including a buried region within the semiconductor surface layer, the buried region having an opposite second conductivity type and being spaced apart from the top surface by a portion of the semiconductor surface layer having the first conductivity type, an interface between the buried region and the portion of the semiconductor surface layer forming a p-n junction of the diode;
   a dielectric layer over the semiconductor surface layer; and
   a metal layer located over the dielectric layer and including an aperture extending laterally in a first direction over the semiconductor surface layer and laterally spaced apart from the buried region in a second direction.

2. The integrated circuit of claim 1, further comprising a diode contact region having the second conductivity type extending from the top surface to the buried region.

3. The integrated circuit of claim 1, wherein the semiconductor surface layer has a first majority carrier concentration and is located over a semiconductor substrate having the first conductivity type and a greater second majority carrier concentration.

4. The integrated circuit of claim 1, wherein the diode is a first diode and the buried region is a first buried region, and further comprising a second diode including a second buried region within the semiconductor surface layer, the second buried region having the second conductivity type and being spaced apart from the top surface by a portion of the semiconductor surface layer having the first conductivity type, and the aperture is located laterally between the first and second buried regions.

5. The integrated circuit of claim 4, further comprising a well region located between the first and second buried regions and having the first conductivity type, the well region having a majority carrier concentration greater than a majority carrier concentration of the semiconductor surface layer.

6. The integrated circuit of claim 1, wherein the diode is one of a plurality of diodes, each diode of the plurality of diodes located in a unit cell of an array of optical sensors.

7. The integrated circuit of claim 4, wherein the first and second diodes are configured to provide a measure of an angle between a normal to the top surface and an incident light source, the measure being linearly related to the angle over a range of at least ±60°.

8. The integrated circuit of claim 1, wherein the buried region has a length and width, the length being at least 10 times the width.

9. The integrated circuit of claim 5, wherein the well region is a diode well region and further comprising a transistor formed in or over the semiconductor substrate, the transistor comprising a transistor well region having a same dopant profile as the diode well region.

10. The integrated circuit of claim 1, wherein the first conductivity type is p-type and the second conductivity type is n-type.

11. An integrated circuit, comprising:
    a semiconductor substrate with a semiconductor surface layer having a first conductivity type and a top surface;
    a first diode including a first buried region within the semiconductor surface layer and a second diode including a second buried region within the semiconductor surface layer, the first and second buried regions having an opposite second conductivity type, the first buried region being spaced apart from the top surface of the semiconductor surface layer by a first portion of the semiconductor surface layer having the first conductivity type, the second buried region being spaced apart from the top surface of the semiconductor surface layer by a second portion of the semiconductor surface layer having the first conductivity type, an interface between the first buried region and the first portion of the semiconductor surface layer forming a p-n junction of the first diode, an interface between the second buried region and the second portion of the semiconductor surface layer forming a p-n junction of the second diode, the first and second buried regions having a length along a long axis in a first direction and a width along a short axis in a second direction orthogonal to the first direction, the length being at least 10 times the width and the first and second buried regions laterally spaced apart by a spacing distance within the semiconductor surface layer along the second direction;
    a dielectric layer over the semiconductor surface layer; and
    a metal layer located over the dielectric layer and including an aperture extending laterally between the first and second buried regions, the aperture having a width less than the spacing distance between the first and second buried regions.

12. The integrated circuit of claim 11, wherein the length of the first and second buried regions is less than an extent of the aperture in the first direction.

13. The integrated circuit of claim 11, wherein the dielectric layer has a refractive index of at least 2.0 @ 660 nm.

14. The integrated circuit of claim 11, wherein the semiconductor surface layer is located on a heavily doped substrate layer having the first conductivity type.

15. The integrated circuit of claim 11, further comprising a third diode including a third buried region within the semiconductor surface layer and a fourth diode including a fourth buried region within the semiconductor surface layer, the third buried region being spaced apart from the top surface of the semiconductor surface layer by a third portion of the semiconductor surface layer having the first conductivity type, the fourth buried region being spaced apart from the top surface of the semiconductor surface layer by a fourth portion of the semiconductor surface layer having the first conductivity type, the third and fourth buried regions having the second conductivity type, a length along a long axis in the second direction and a width along a short axis in the first direction, the length being at least 10 times the width and the third and fourth buried regions laterally spaced apart within the semiconductor surface layer along the first direction.

16. The integrated circuit of claim 11, wherein the first and second diodes form a diode subarray, and further comprising a plurality of instances of the diode subarray arranged in a regular grid pattern.

17. The integrated circuit of claim 11, wherein the aperture is square.

18. The integrated circuit of claim 11, further comprising:

a diode well region located between the first and second buried regions and having the first conductivity type, the diode well region having a majority carrier concentration greater than a majority carrier concentration of the semiconductor surface layer; and a transistor formed in or over the semiconductor substrate, the transistor comprising a transistor well region having a same dopant profile as the diode well region.

19. The integrated circuit of claim 11, wherein a metal interconnection within the dielectric layer electrically connects the first buried region to a terminal of a transistor.

20. The integrated circuit of claim 11, wherein the first conductivity type is N-type and the second conductivity type is P-type.

21. The integrated circuit of claim 11, wherein the dielectric layer includes a plurality of silicon oxide layers, adjacent ones of the silicon oxide layers having a corresponding silicon nitride layer between.

* * * * *